(12) United States Patent
Li et al.

(10) Patent No.: US 11,238,763 B2
(45) Date of Patent: Feb. 1, 2022

(54) DETECTION CIRCUIT OF GATE DRIVER, ARRAY SUBSTRATE, DISPLAY DEVICE AND DETECTION METHOD THEREOF

(71) Applicants: Hefei Xinsheng Optoelectronics Technology Co., Ltd., Anhui (CN); BOE Technology Group Co., Ltd., Beijing (CN)

(72) Inventors: Meng Li, Beijing (CN); Zhigang Song, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/758,900

(22) PCT Filed: Sep. 27, 2019

(86) PCT No.: PCT/CN2019/108724
§ 371 (c)(1),
(2) Date: May 7, 2020

(87) PCT Pub. No.: WO2020/088176
PCT Pub. Date: May 7, 2020

(65) Prior Publication Data
US 2021/0241663 A1    Aug. 5, 2021

(30) Foreign Application Priority Data

Oct. 31, 2018    (CN) .......................... 201811284553.9

(51) Int. Cl.
*G09G 3/00* (2006.01)
*G09G 3/20* (2006.01)
*G11C 19/28* (2006.01)

(52) U.S. Cl.
CPC ............... *G09G 3/006* (2013.01); *G09G 3/20* (2013.01); *G11C 19/287* (2013.01);
(Continued)

(58) Field of Classification Search
CPC ..................... G09G 3/006; G09G 3/20; G09G 2310/0286; G09G 2310/0267; G09G 2310/08; G11C 19/287
See application file for complete search history.

(56) References Cited

U.S. PATENT DOCUMENTS

| | | | |
|---|---|---|---|
| 2011/0102388 A1* | 5/2011 | Chin | ...................... G11C 19/00 345/205 |
| 2016/0247430 A1* | 8/2016 | Cho | ..................... G09G 3/3677 |

(Continued)

FOREIGN PATENT DOCUMENTS

| | | |
|---|---|---|
| CN | 105513518 A | 4/2016 |
| CN | 106448522 A | 2/2017 |

(Continued)

OTHER PUBLICATIONS

Office Action for corresponding Chinese Application 201811284553.9 dated Jan. 2, 2020.

*Primary Examiner* — Premal R Patel
(74) *Attorney, Agent, or Firm* — Arent Fox LLP; Michael Fainberg

(57) ABSTRACT

The present disclosure discloses a detection circuit of a gate driver, an array substrate, a display device and a detection method thereof. Gate scanning signals of each of the signal output ends are derived to a detection signal line through signal deriving circuits, such that the gate scanning signals are transmitted to a discrimination circuit outside the array substrate. The discrimination circuit can acquire in real time and record the gate scanning signals, so as to detect the gate scanning signals in real time, and further rapidly diagnose whether the gate scanning signals are abnormal based on (Continued)

detection results, and rapidly locate the positions at which the gate scanning signals are abnormal, so as to timely troubleshoot the fault.

17 Claims, 23 Drawing Sheets

(52) U.S. Cl.
CPC ............... *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2017/0186349 A1 | 6/2017 | Arima | |
| 2019/0333432 A1* | 10/2019 | Chen | ................... G09G 3/006 |

FOREIGN PATENT DOCUMENTS

| | | |
|---|---|---|
| CN | 109243347 A | 1/2019 |
| WO | 2015125199 A1 | 8/2015 |

* cited by examiner

DETECTION CIRCUIT OF GATE DRIVER, ARRAY SUBSTRATE, DISPLAY DEVICE AND DETECTION METHOD THEREOF

The present disclosure is a National Stage of International Application No. PCT/CN2019/108724, filed Sep. 27, 2019, which claims the priority of Chinese patent application No. 201811284553.9, filed with Chinese Patent Office on Oct. 31, 2018, and entitled "Detection Circuit of Gate Driver and Display Device", the contents of which are incorporated by reference herein in its entirety.

FIELD

The present disclosure relates to the field of display technology, in particular to a detection circuit of a gate driver, an array substrate, a display device and a detection method thereof.

BACKGROUND

At present, in order to reduce manufacturing cost of the display device and realize the purpose of a narrow border of the display device, a gate driver on array (GOA) technology is adopted increasingly in the manufacturing process of the display device, and corresponding gate scanning signals are output through a GOA circuit. Whether each level of gate scanning signals are normal directly influences the display of the display device. Once the gate scanning signals output by a certain level of GOA go wrong, the display will be abnormal.

Since all the GOA circuits are integrated inside a panel, gate scanning signal waveforms on each gate line cannot be obtained from the outside, which is very unfavorable for later analysis of product problems, therefore, detection on gate scanning signals is very essential.

In consequence, how to detect gate scanning signals has become a problem which needs to be solved urgently at present.

SUMMARY

An embodiment of the present disclosure provides a detection circuit of a gate driver, including: a plurality of first signal deriving sub-circuits, where a control end of each first signal deriving sub-circuit is coupled with a control signal line, and an input end of the each first signal deriving sub-circuit is coupled with at least one signal output end of the gate driver; and a plurality of second signal deriving sub-circuits, where the plurality of second signal deriving sub-circuits are in one-to-one correspondence with the plurality of first signal deriving sub-circuits, a control end of each second signal deriving sub-circuit is coupled with an output end of a corresponding first signal deriving sub-circuit, the control end of the each second signal deriving sub-circuit is coupled with a signal output end which is coupled with the corresponding first signal deriving sub-circuit, and an output end of the each second signal deriving sub-circuit is coupled with a detection signal line.

Optionally, the plurality of second signal deriving sub-circuits are coupled with the same detection signal line; and timing sequences of gate scanning signals output by each of the at least one signal output end corresponding to the each second signal deriving sub-circuit which is coupled with the same detection signal line are not overlapped with each other.

Optionally, the gate driver includes a plurality of cascaded shifting registers, where each shifting register includes at least two signal output ends, and respective signal output ends of the each shifting register are coupled with different detection signal lines.

Optionally, the each first signal deriving sub-circuit includes a first switch transistor, where a gate of the first switch transistor is coupled with the control signal line, a first electrode of the first switch transistor is coupled with a corresponding signal output end, and a second electrode of the first switch transistor is coupled with a corresponding second signal deriving sub-circuit.

Optionally, the each second signal deriving sub-circuit includes a second switch transistor, where a gate of the second switch transistor is coupled with a corresponding signal output end, a first electrode of the second switch transistor is coupled with the corresponding first signal deriving sub-circuit, and a second electrode of the second switch transistor is coupled with a corresponding detection signal line.

Optionally, respective first signal deriving sub-circuits are coupled with the same control signal line.

Optionally, the detection circuit further includes a discrimination circuit, and the discrimination circuit includes: an analogue-to-digital conversion circuit configured to be coupled with the detection signal line; and a counting circuit configured to be coupled with the analogue-to-digital conversion circuit.

Optionally, the detection circuit further includes: a first control circuit, where a control end of the first control circuit is coupled with a first clock signal end, an input end of the first control circuit is coupled with a first reference signal end, and an output end of the first control circuit is coupled with one end of the control signal line; and a second control circuit, where a control end of the second control circuit is coupled with a second clock signal end, an input end of the second control circuit is coupled with the second reference signal end, and an output end of the second control circuit is coupled with the other end of the control signal line.

Optionally, the first control circuit includes a third switch transistor, where a gate of the third switch transistor is coupled with the first clock signal end, a first electrode of the third switch transistor is coupled with the first reference signal end, and a second electrode of the third switch transistor is coupled with the control signal line.

Optionally, the second control circuit includes a fourth switch transistor, where a gate of the fourth switch transistor is coupled with the second clock signal end, a first electrode of the fourth switch transistor is coupled with the second reference signal end, and a second electrode of the fourth switch transistor is coupled with the control signal line.

Optionally, wherein the each first signal deriving sub-circuit includes a first switch transistor, the each second signal deriving sub-circuit includes a second switch transistor, where a gate of the first switch transistor is coupled with the control signal line, a first electrode of the first switch transistor and a gate of the second switch transistor are coupled with the same signal output end, a second electrode of the first switch transistor is coupled with a first electrode of the second switch transistor, and a second electrode of the second switch transistor is coupled with the corresponding detection signal line; the detection circuit further includes a third switch transistor and a fourth switch transistor, wherein a gate of the third switch transistor is coupled with the first clock signal end, a first electrode of the third switch transistor is coupled with the first reference signal end, a second electrode of the third switch transistor is coupled with one end of the control signal line, a gate of the fourth switch transistor is coupled with the second clock signal end, a first electrode of the fourth switch transistor is coupled with a second reference signal end, and a second electrode of the fourth switch transistor is coupled with the other end of the control signal line.

Correspondingly, an embodiment of the present disclosure further provides an array substrate, including: a gate driver, including a plurality of signal output ends; a plurality of gate lines, where one of the plurality of gate lines is coupled with one of the plurality of signal output ends; a plurality of drive circuits arranged in an array, where one of the plurality of drive circuits is coupled with at least one gate line; and the above detection circuit provided in an embodiment of the present disclosure.

Optionally, the gate driver includes a plurality of cascaded shifting registers, where each shifting register includes two signal output ends which are respectively a first signal output end and a second signal output end; each drive circuit includes: a fifth switch transistor, where a gate of the fifth switch transistor is coupled with the first signal output end through one gate line, and a source of the fifth switch transistor is coupled with a data line; a drive transistor, where a gate of the drive transistor is coupled with a drain of the fifth switch transistor, and a source of the drive transistor is coupled with a first supply voltage signal end; a sixth switch transistor, where a gate of the sixth switch transistor is coupled with the second signal output end through one gate line, a source of the sixth switch transistor is coupled with a drain of the drive transistor, and a drain of the sixth switch transistor is coupled with an induction signal line; a capacitor, coupled between the gate of the drive transistor and the drain of the drive transistor; and a to-be-driven element, coupled between the drain of the drive transistor and a second supply voltage signal end.

Optionally, the first supply voltage signal end and the first reference signal end are the same signal end, and the second supply voltage signal end and the second reference signal end are the same signal end.

Correspondingly, an embodiment of the present disclosure further provides a display device, including the above array substrate provided in an embodiment of the present disclosure.

Correspondingly, an embodiment of the present disclosure further provides a detection method of the above display device, including: controlling the plurality of signal output ends of the gate driver to output in sequence gate scanning signals; loading a first reference signal to the control signal line in a detection time period, the first signal deriving sub-circuits transmit the gate scanning signals output by coupled signal output ends to the second signal deriving sub-circuit under the control of the first reference signal, and the second signal deriving sub-circuits transmit received gate scanning signals to a coupled detection signal line under the control of the gate scanning signals output by the coupled signal output ends; and performing, by the discrimination circuit, abnormality diagnosis on the gate scanning signals transmitted by the detection signal line.

Optionally, the performing by the discrimination circuit, abnormality diagnosis on the gate scanning signals transmitted by the detection signal line specifically includes: converting, by an analogue-to-digital conversion circuit, the received gate scanning signals into digital signals; and accumulating, by a counting circuit, a quantity of pulses of received digital signals, to perform abnormality diagnosis on the gate scanning signals.

Optionally, the detection method further includes: in a non-detection stage, loading second reference signals to the control signal line, and disconnecting, by the first signal deriving sub-circuits, the signal output ends from the second signal deriving sub-circuits.

DETAILED DESCRIPTION OF THE EMBODIMENTS

Figure 1A:
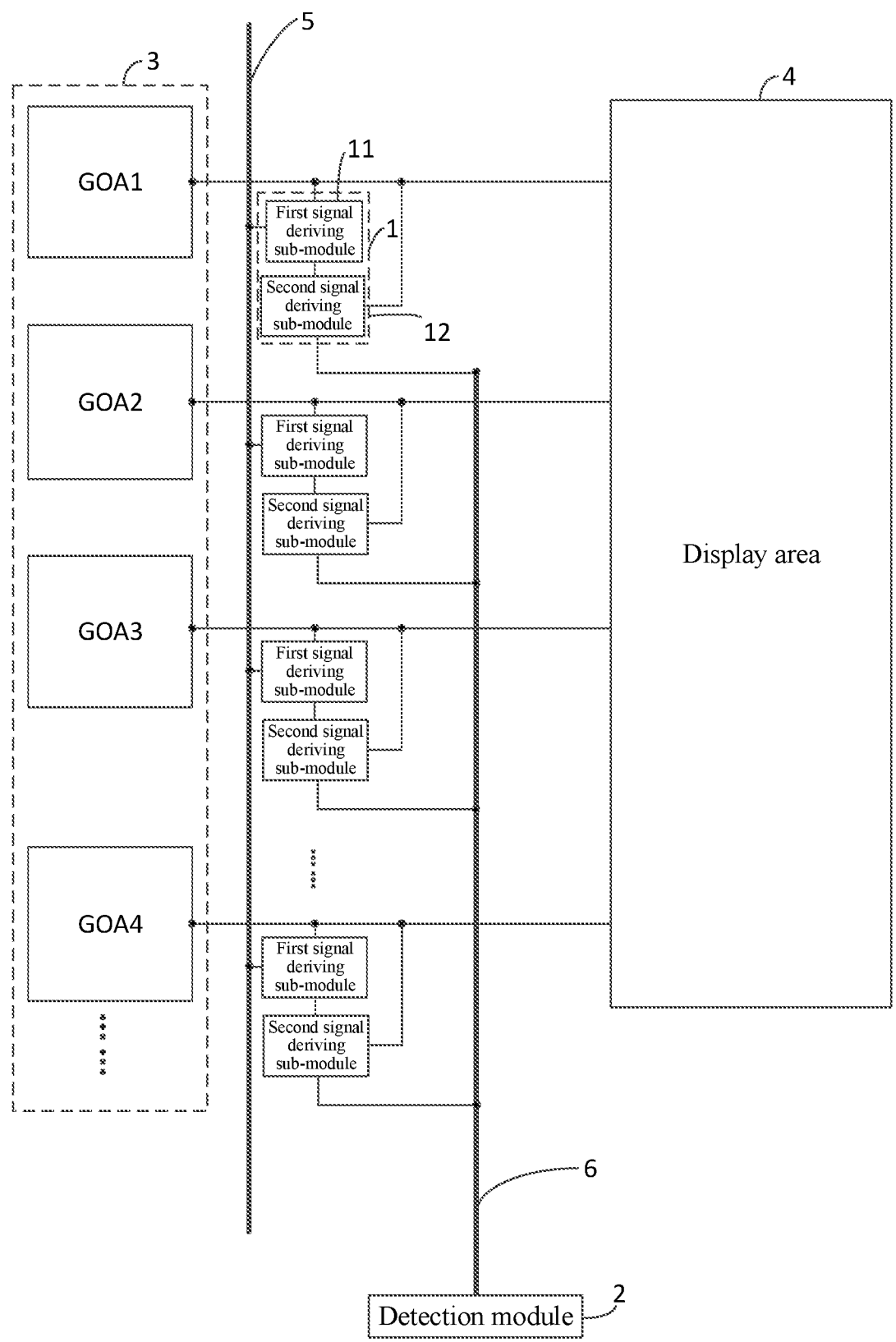
FIG. 1A is a structural schematic diagram of a detection circuit of a gate driver provided in an embodiment of the present disclosure.

In order to make the objectives, technical solutions, and advantages of the present disclosure clearer, the present disclosure will be described in detail below in combination with accompanying drawings. Apparently, the described embodiments are only a part but not all of the embodiments of the present disclosure. Based upon the embodiments of the present disclosure, all of the other embodiments obtained by those skilled in the art without any creative effort shall all fall within the protection scope of the present disclosure.

The shape and size of each part in the accompanying drawings do not reflect true proportions, merely aiming at schematically illustrating the content of the present disclosure.

As shown in FIG. 1A to FIG. 3B, a detection circuit of a gate driver provided in an embodiment of the present disclosure includes signal deriving circuits 1 which are set corresponding to respective signal output ends (SW1, SW2 . . . ) of a gate driver 3. Specifically, the respective signal output ends can be in one-to-one correspondence with the signal deriving circuits 1, and can also be set in a many-to-one manner, and the setting manners are not limited herein. The signal deriving circuit 1 includes a first signal deriving sub-circuit 11 and a second signal deriving sub-circuit 12; and the gate driver 3 includes multiple cascaded shifting registers (GOA1, GOA2, GOA3, GOA4 . . . ).

When the respective signal output ends can be set to be in one-to-one correspondence with the signal deriving circuits 1, each of the first signal deriving sub-circuits 11 is in one-to-one correspondence with each of the signal output ends (SW1, SW2 . . . ) of the gate driver 3, a control end of the first signal deriving sub-circuit 11 is coupled with the control signal line 5, an input end of the first signal deriving sub-circuit 11 is coupled with one or more corresponding signal output ends (SW1, SW2), that is, the first signal deriving sub-circuit 11 is configured to transmit gate scanning signals output by the coupled signal output ends (SW1, SW2 . . . ) to the second signal deriving sub-circuit 12 under the control of the first reference signals loaded by the coupled control signal line 5.

When the respective signal output ends can be set to be in one-to-one correspondence with the signal deriving circuits 1, the respective second signal deriving sub-circuits 12 are in one-to-one correspondence with respective signal output ends (SW1, SW2 . . . ) of the gate driver 3, a control end of the second signal deriving sub-circuit 12 is coupled with an output end of the first signal deriving sub-circuit 11, the control end of the second signal deriving sub-circuit 12 is coupled with one or more corresponding signal output ends (SW1, SW2 . . . ), and an output end of the second signal deriving sub-circuit 12 is coupled with the detection signal line 6, that is, the second signal deriving sub-circuit 12 is configured to transmit the received gate scanning signals to the detection signal line 6 under the control of the gate scanning signals output by the coupled signal output ends (SW1, SW2 . . . ).

Moreover, in the display device containing the detection circuit provided in an embodiment of the present disclosure, a discrimination circuit 2 coupled with the detection signal line 6 is further included, and the discrimination circuit 2 is configured to perform abnormality diagnosis on received gate scanning signals. The discrimination circuit 2 can be set in a master controller of a display device, and can also be set on an array substrate, which will not be defined herein.

As to the above detection circuit of the gate driver provided in an embodiment of the present disclosure, the gate scanning signals of each of the signal output ends are derived to a detection signal line through the signal deriving circuit 1, such that the gate scanning signals are transmitted to the discrimination circuit 2 outside the array substrate. The discrimination circuit 2 can acquire in real time and record the gate scanning signals, to detect the gate scanning signals in real time, and further rapidly diagnose whether the gate scanning signals are abnormal based on detection results, and rapidly locate the position at which the gate scanning signals are abnormal, so as to timely troubleshoot the fault.

Optionally, since the detection circuit and the gate driver are generally arranged on the peripheral area of the array substrate, to narrow the space occupied by wiring, in the above detection circuit of the gate driver provided in an embodiment of the present disclosure, as shown in FIG. 1A to FIG. 3B, multiple second signal deriving sub-circuits 12 can be coupled with the same detection signal line 6, to save the space of the peripheral area occupied by wiring.

Moreover, the timing sequences of the gate scanning signals output by the signal output ends (SW1, SW2 . . . ) corresponding to each of the second signal deriving sub-circuits 12 which is coupled with the same detection signal line 6 are not overlapped with each other, thereby ensuring that the detection signal line only transmits the gate scanning signals output by a certain signal output end at any moment, to ensure detection accuracy.

Figure 1B:
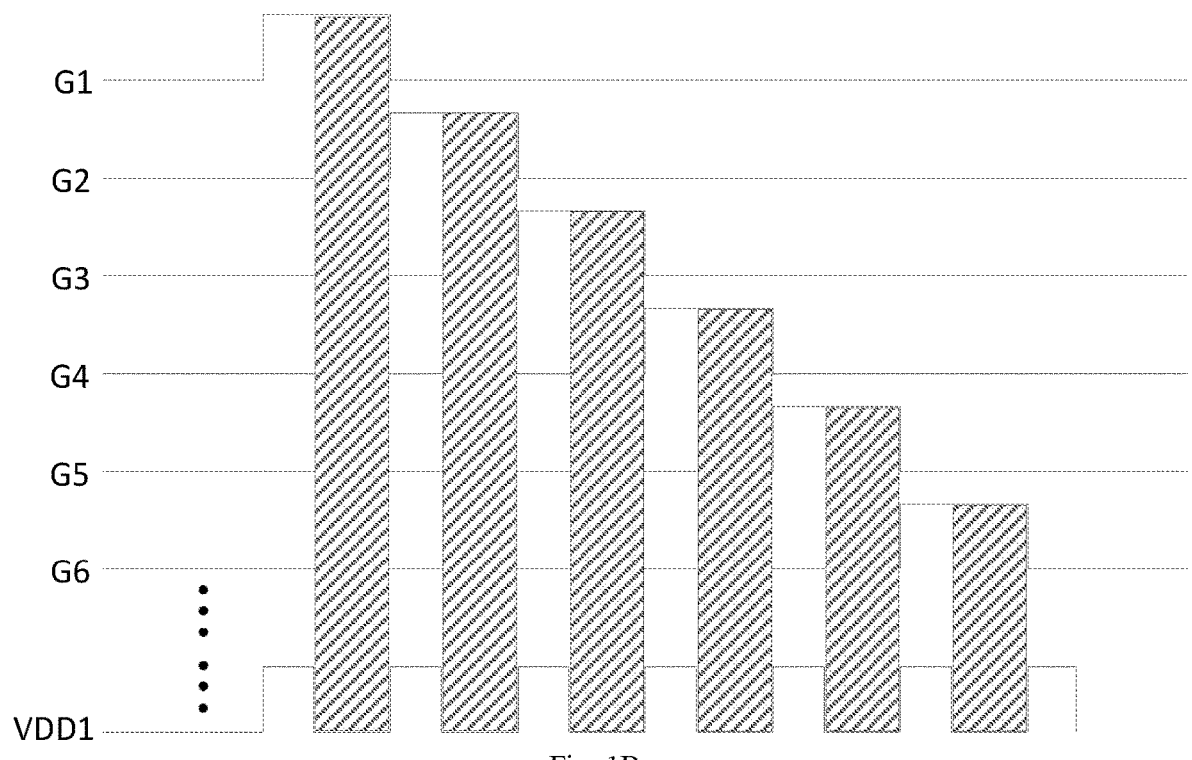
FIG. 1B is a sequence chart of signals corresponding to a detection circuit of a gate driver as shown in FIG. 1A.
Figure 2A:
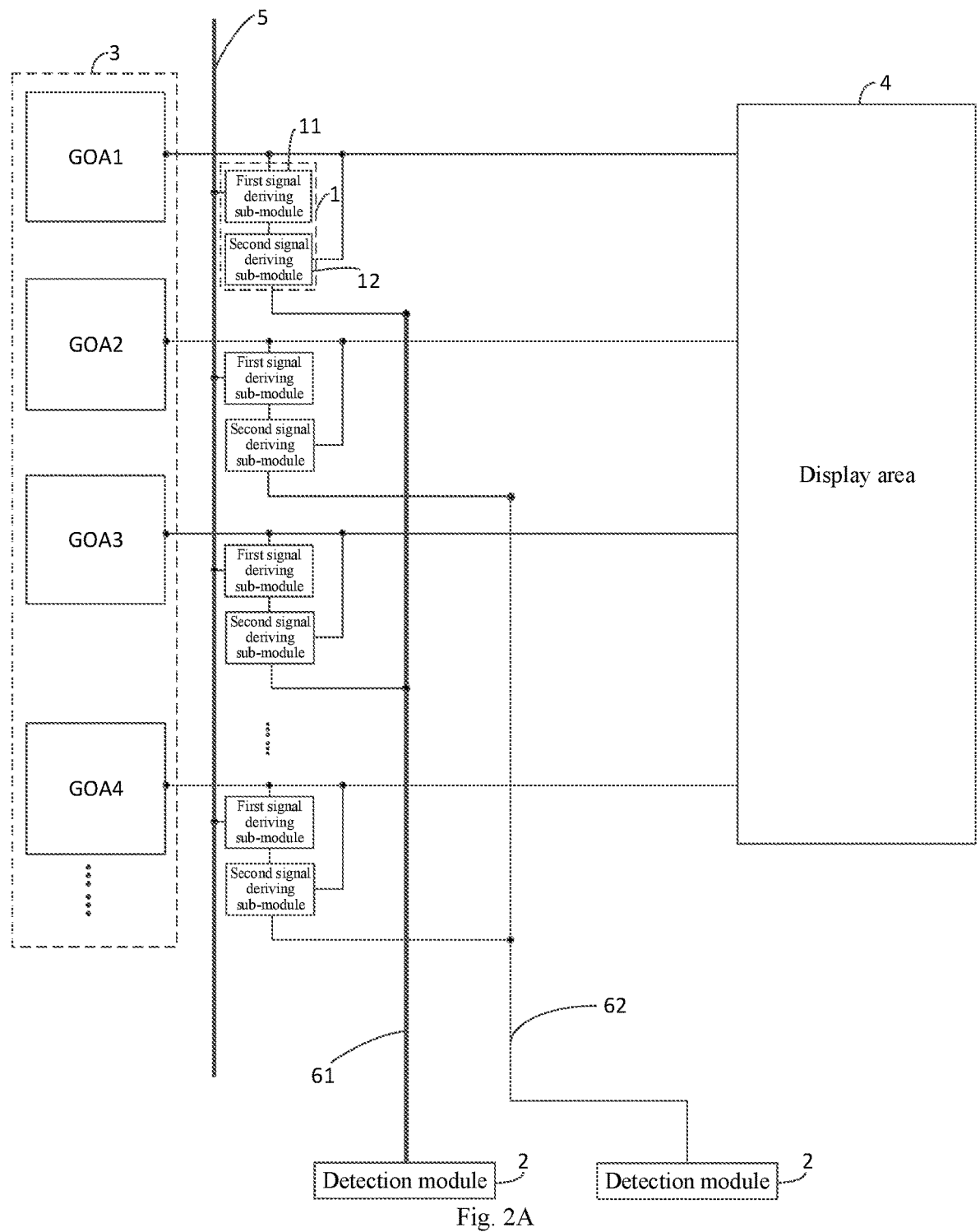
FIG. 2A is another structural schematic diagram of a detection circuit of a gate driver provided in an embodiment of the present disclosure.
Figure 2B:
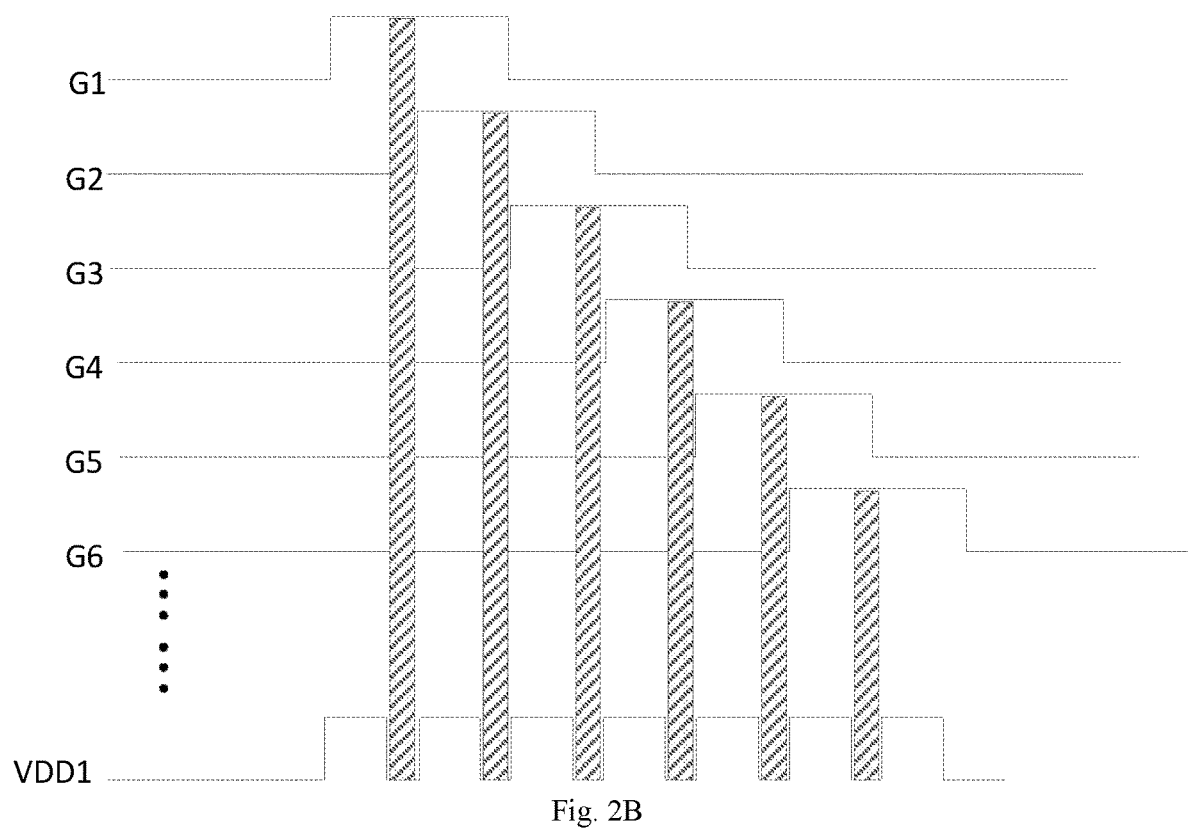
FIG. 2B is a sequence chart of signals corresponding to a detection circuit of a gate driver as shown in FIG. 2A.

Specifically, as shown in FIG. 1A and FIG. 2A, each of the shifting registers (GOA1, GOA2, GOA3, GOA4 . . . ) includes a signal output end SW1. When the gate scanning signals output by each signal output end SW1 are overlapped without a timing sequence, the output sequence chart corresponding to the gate scanning signals is as shown in FIG. 1B, and a discrimination circuit 2 coupled with the same detection signal line 6 can be adopted to perform abnormality diagnosis on gate scanning signals, as shown in FIG. 1A. When the gate scanning signals output by each signal output end SW1 are overlapped in a timing sequence, the output sequence chart corresponding to the gate scanning signals is as shown in FIG. 2B, for example, the gate scanning signals in odd-numbered lines (G1, G3, G5 . . . ) are overlapped without a timing sequence, while the gate scanning signals in even-numbered lines (G2, G4, G6 . . . ) are overlapped without a timing sequence, therefore, a discrimination circuit 2 coupled with one detection signal line 6 can be adopted to perform abnormality diagnosis on the gate scanning signals in odd-numbered lines, and the other discrimination circuit 2 coupled with the other detection signal line 6 can be adopted to perform abnormality diagnosis on the gate scanning signals in even-numbered lines, as shown in FIG. 2A.

Figure 3A:
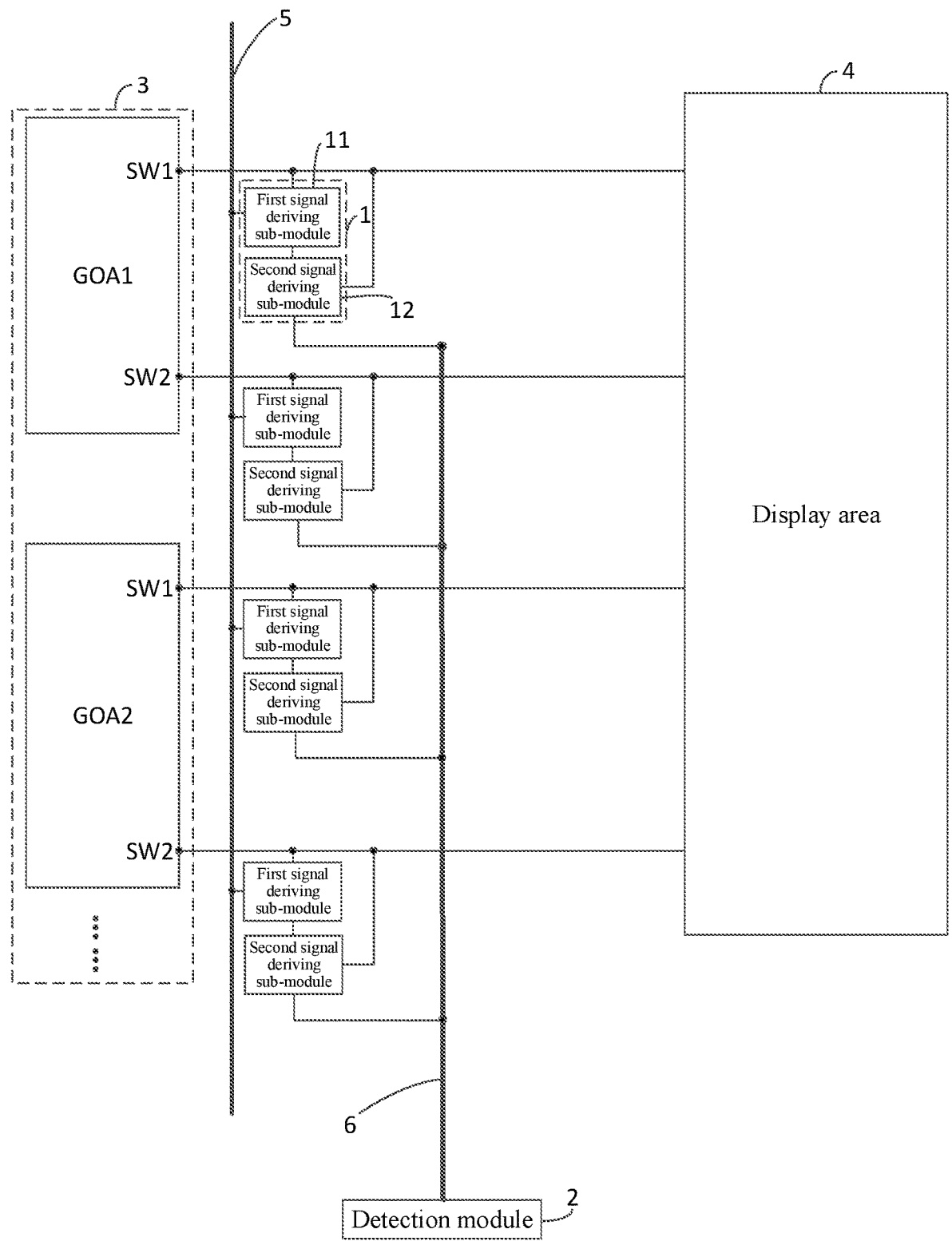
FIG. 3A is another structural schematic diagram of a detection circuit of a gate driver provided in an embodiment of the present disclosure.
Figure 3B:
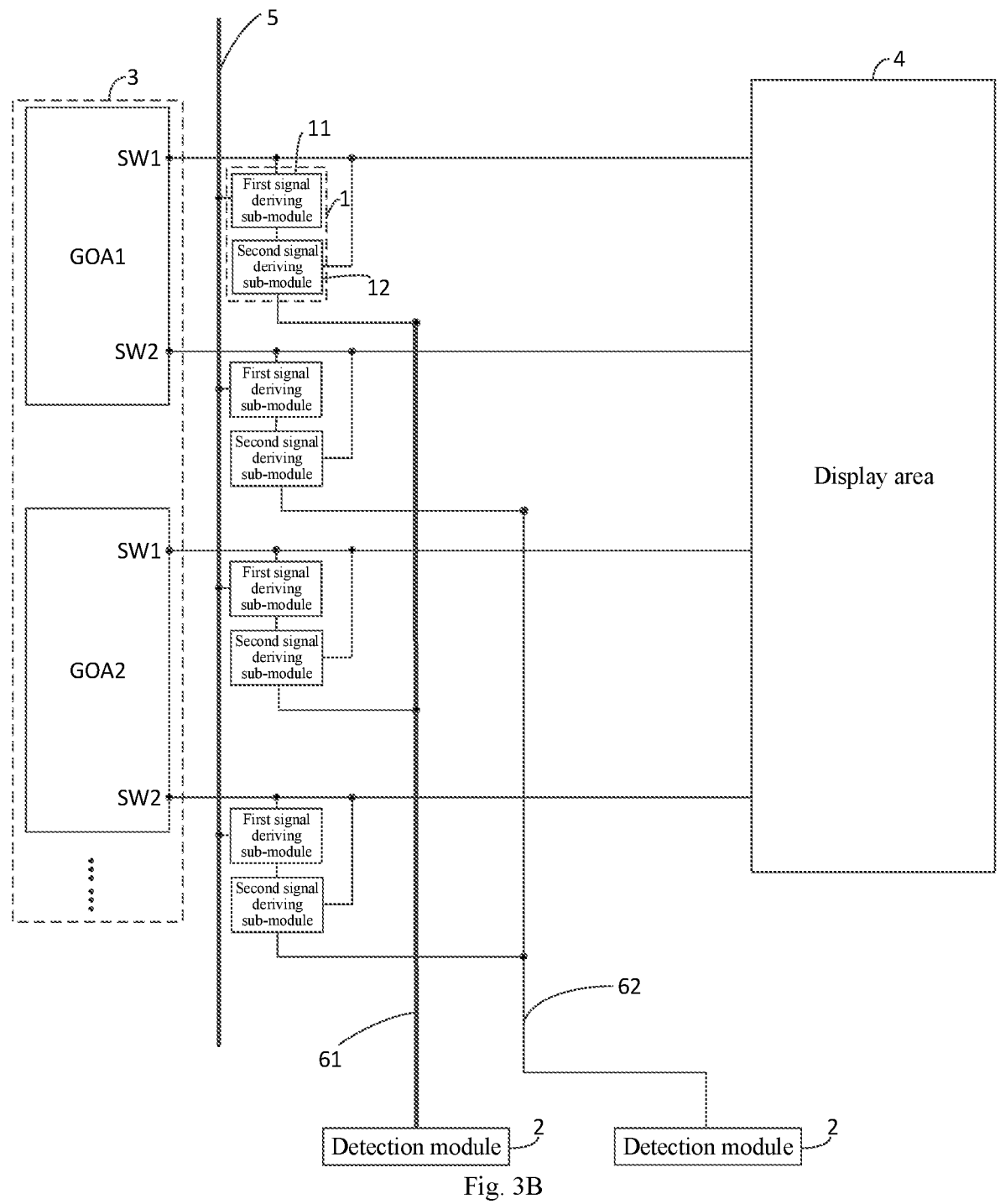
FIG. 3B is another structural schematic diagram of a detection circuit of a gate driver provided in an embodiment of the present disclosure.
Figure 3C:
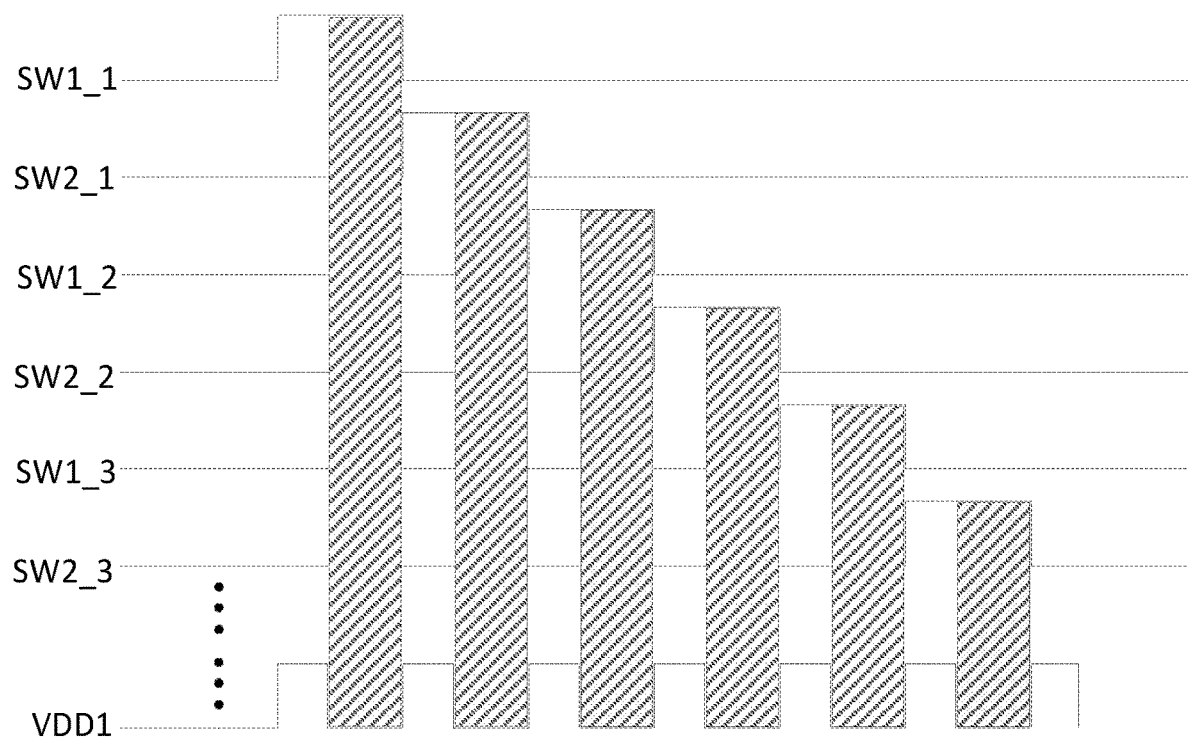
FIG. 3C is a sequence chart of signals corresponding to a detection circuit of a gate driver as shown in FIG. 3A.
Figure 3D:
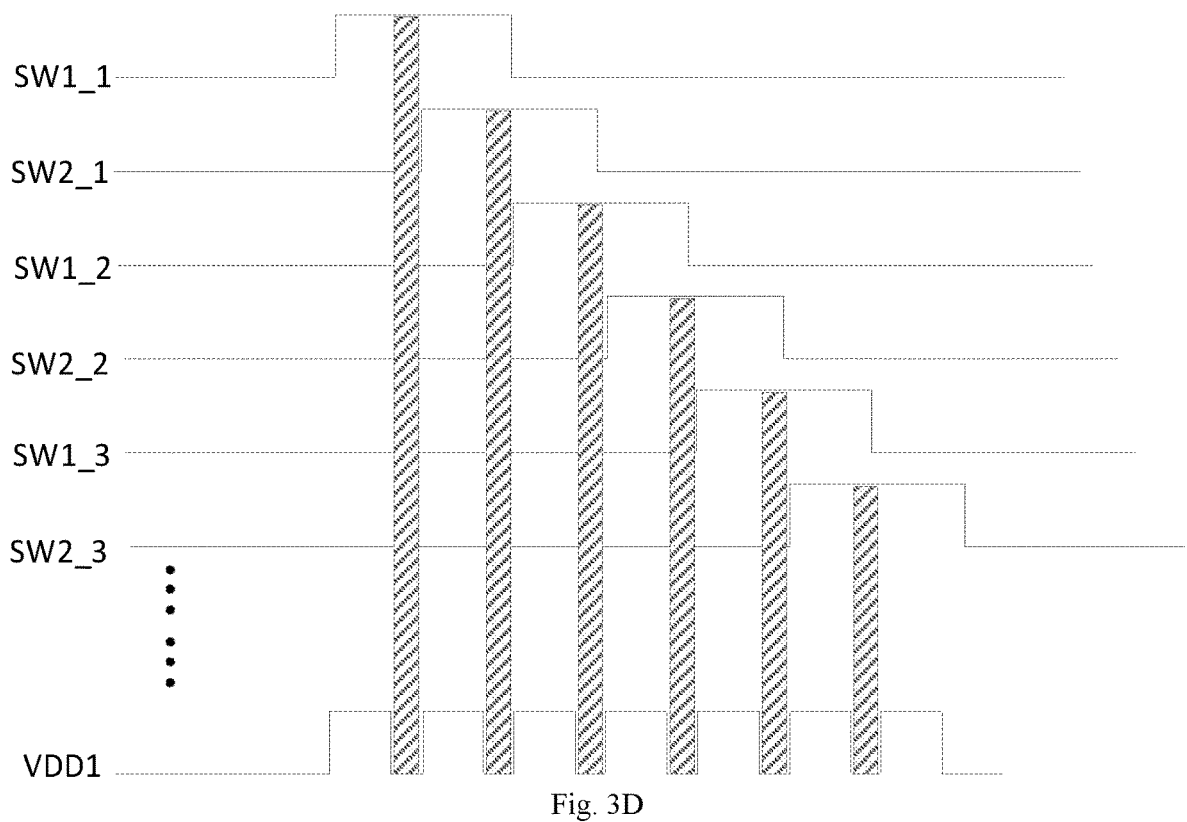
FIG. 3D is a sequence chart of signals corresponding to a detection circuit of a gate driver as shown in FIG. 3B.

Optionally, in the above detection circuit of the gate driver provided in an embodiment of the present disclosure, as shown in FIG. 3A and FIG. 3B, each of the shifting registers (GOA1, GOA2 . . . ) can include at least two signal output ends (SW1, SW2 . . . ), in the figures, two signal output ends SW1 and SW2 are taken as an example. When the gate scanning signals output by each of the signal output ends SW1 and SW2 are overlapped without a timing sequence, the output sequence chart corresponding to the gate scanning signals is as shown in FIG. 3C, and a discrimination circuit 2 coupled with the same detection signal line 6 can be adopted to perform abnormality diagnosis on gate scanning signals, as shown in FIG. 3A. When the gate scanning signals output by each of the signal output ends SW1 and SW2 are overlapped in a timing sequence, the output sequence chart corresponding to the gate scanning signal is as shown in FIG. 3D, for example, the gate scanning signals output by each signal output end SW1 are overlapped without a timing sequence, and the gate scanning signals output by each signal output end SW2 are overlapped without a timing sequence, therefore, a discrimination circuit 2 coupled with the same detection signal line 6 can be adopted to perform abnormality diagnosis on gate scanning signals output by each signal output end SW1, and the other discrimination circuit 2 coupled with the other detection signal line 6 can be adopted to perform abnormality diagnosis on gate scanning signals output by each signal output end SW2, as shown in FIG. 3B.

Figure 4A:
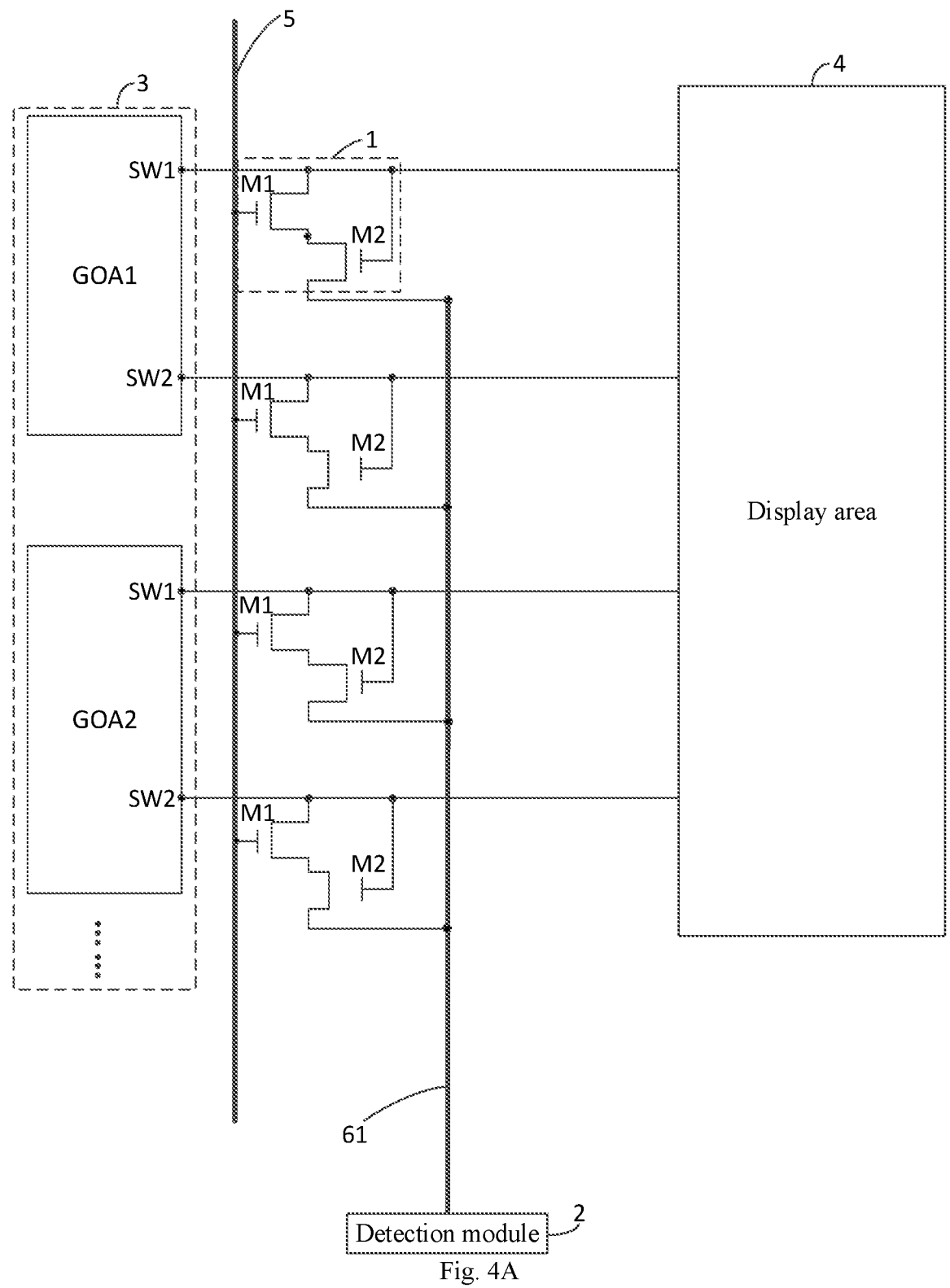
FIG. 4A is another structural schematic diagram of a detection circuit of a gate driver provided in an embodiment of the present disclosure.
Figure 4B:
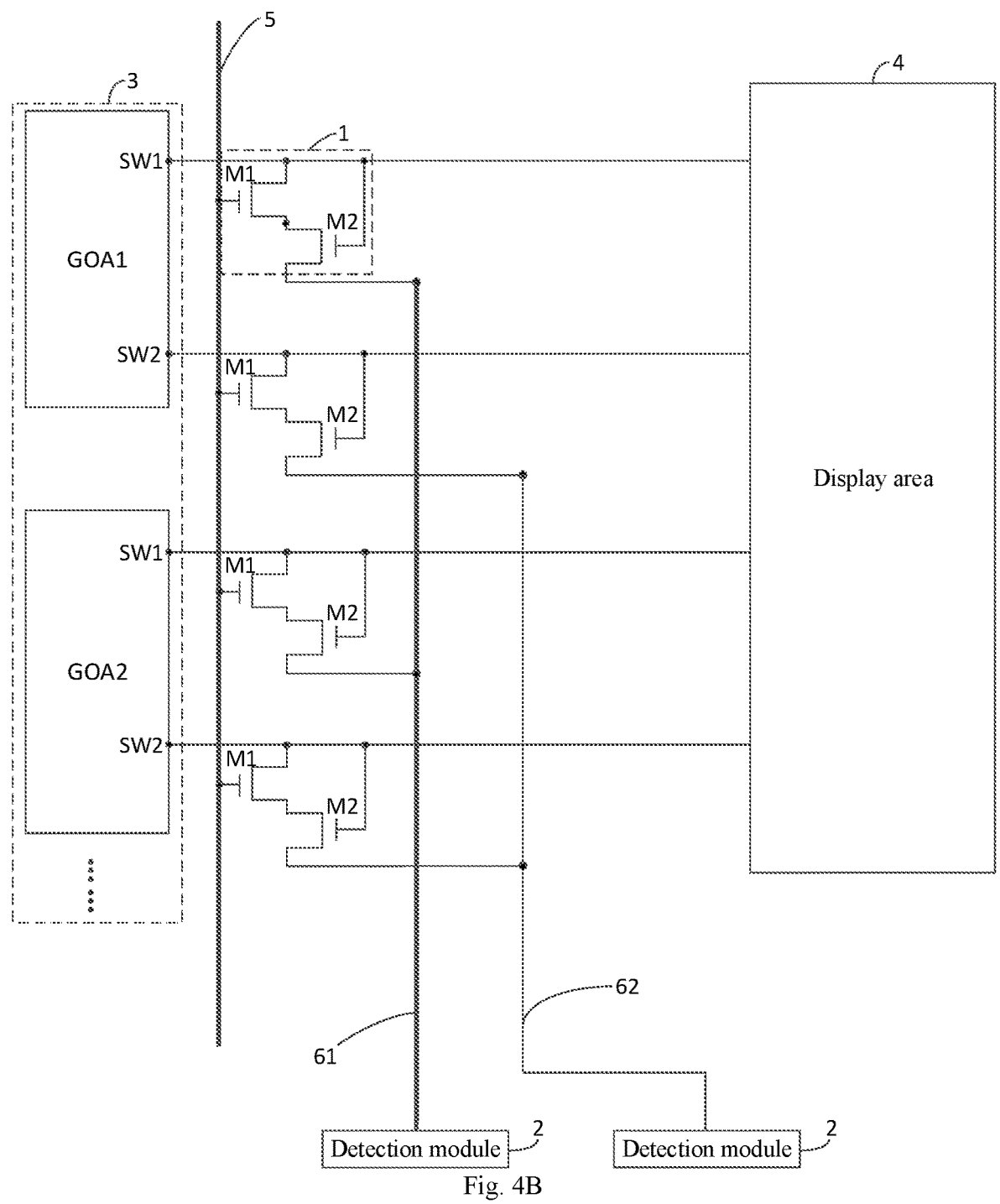
FIG. 4B is another structural schematic diagram of a detection circuit of a gate driver provided in an embodiment of the present disclosure.

Optionally, in the above detection circuit of the gate driver provided in an embodiment of the present disclosure, as shown in FIG. 4A and FIG. 4B, the first signal deriving sub-circuit 11 includes a first switch transistor M1, wherein a gate of the first switch transistor M1 coupled with the signal output end SW1 is coupled with the control signal line 5, a first electrode of the first switch transistor M1 is coupled with the signal output end SW1, and the second electrode of the first switch transistor M1 is coupled with the second signal deriving sub-circuit 12; the gate of the first switch transistor M1 coupled with the signal output end SW2 is coupled with the control signal line 5, the first electrode of the first switch transistor M1 is coupled with the signal output end SW2, and the second electrode of the first switch transistor M1 is coupled with the second signal deriving sub-circuit 12.

Optionally, in the above detection circuit of the gate driver provided in an embodiment of the present disclosure, as shown in FIG. 4A and FIG. 4B, the second signal deriving sub-circuit 12 includes a second switch transistor M2, wherein a gate of the second switch transistor M2 coupled with the first switch transistor M1 corresponding to the signal output end SW1 is coupled with the signal output end SW1, a first electrode of the second switch transistor M2 is coupled with the first signal deriving sub-circuit 11, and the second electrode of the second switch transistor M2 is coupled with the discrimination circuit 2 through the detection signal line 6; the gate of the second switch transistor M2 coupled with the first switch transistor M1 corresponding to the signal output end SW2 is coupled with the signal output end SW2, the first electrode of the second switch transistor M2 is coupled with the first signal deriving sub-circuit 11, and the second electrode of the second switch transistor M2 is coupled with the discrimination circuit 2 through the detection signal line 6.

Specifically, the gate scanning signals output by each signal output end SW1 are overlapped without a timing sequence, as shown in FIG. 4A, two signal output ends SW1 and SW2 of all the shifting registers (GOA1, GOA2 . . . ) are connected to the same signal deriving circuit 1, and the second electrodes of the second switch transistor M2 in the signal deriving circuit 1 are all coupled with the discrimination circuit 2 through the first detection signal line 61. As shown in FIG. 4B, the detection signal line 6 includes a first detection signal line 61 and a second detection signal line 62, each of the shifting registers (GOA1, GOA2 . . . ) includes two signal output ends SW1 and SW2, the signal output ends SW1 of all the shifting registers are connected to the same signal deriving circuit 1, and the signal output ends SW2 of all the shifting registers are connected to the same signal deriving circuit 1. The second electrodes of the second switch transistor M2 in the signal deriving circuit 1 connected with SW1 are coupled with one discrimination circuit 2 through the first detection signal line 61, and the second electrodes of the second switch transistor M2 in the signal deriving circuit 1 connected with SW2 are both coupled with the other discrimination circuit 2 through the second detection signal line 62. During specific implementation, as shown in FIG. 4A, the first switch transistor M1 is switched on line by line under the control of the control signal line 5, the second switch transistor M2 is switched on under the control of the gate scanning signals, the gate scanning signals output by the signal output end SW1 are transmitted to the second switch transistor M2 through the first switch transistor M1, and are transmitted to the discrimination circuit 2 through the first detection signal line 61 coupled with the second switch transistor M2, and the discrimination circuit 2 performs abnormality diagnosis on the received gate scanning signals.

As shown in FIG. 4B, the gate lines connected with the signal output end SW1 and the signal output end SW2 are detected separately. The gate scanning signals output through the signal output end SW1 are transmitted to the second switch transistor M2 through the first switch transistor M1, and are transmitted to the discrimination circuit 2 through the first detection signal line 61 coupled with the second switch transistor M2. The discrimination circuit 2 performs abnormality diagnosis on the received gate scanning signals output by the signal output end SW1, the gate scanning signals output by the signal output end SW2 are transmitted to the second switch transistor M2 through the first switch transistor M1, and are transmitted to the discrimination circuit 2 through the second detection signal line 61 coupled with the second switch transistor M2, and the discrimination circuit 2 performs abnormality diagnosis on the received gate scanning signals output by the signal output end SW2.

During specific implementation, as shown in FIG. 4A and FIG. 4B, when the second switch transistor M2 arranged in the detection circuit structure provided in the present disclosure performs abnormality diagnosis, when the signal output at the signal output end is a low-level signal, the second switch transistor M2 is cut off, the problem that the pulse signals transmitted by the detection signal line 6 flow backward to the gate line will not exist, thereby ensuring accuracy of abnormality detection of gate scanning signals.

Figure 5A:
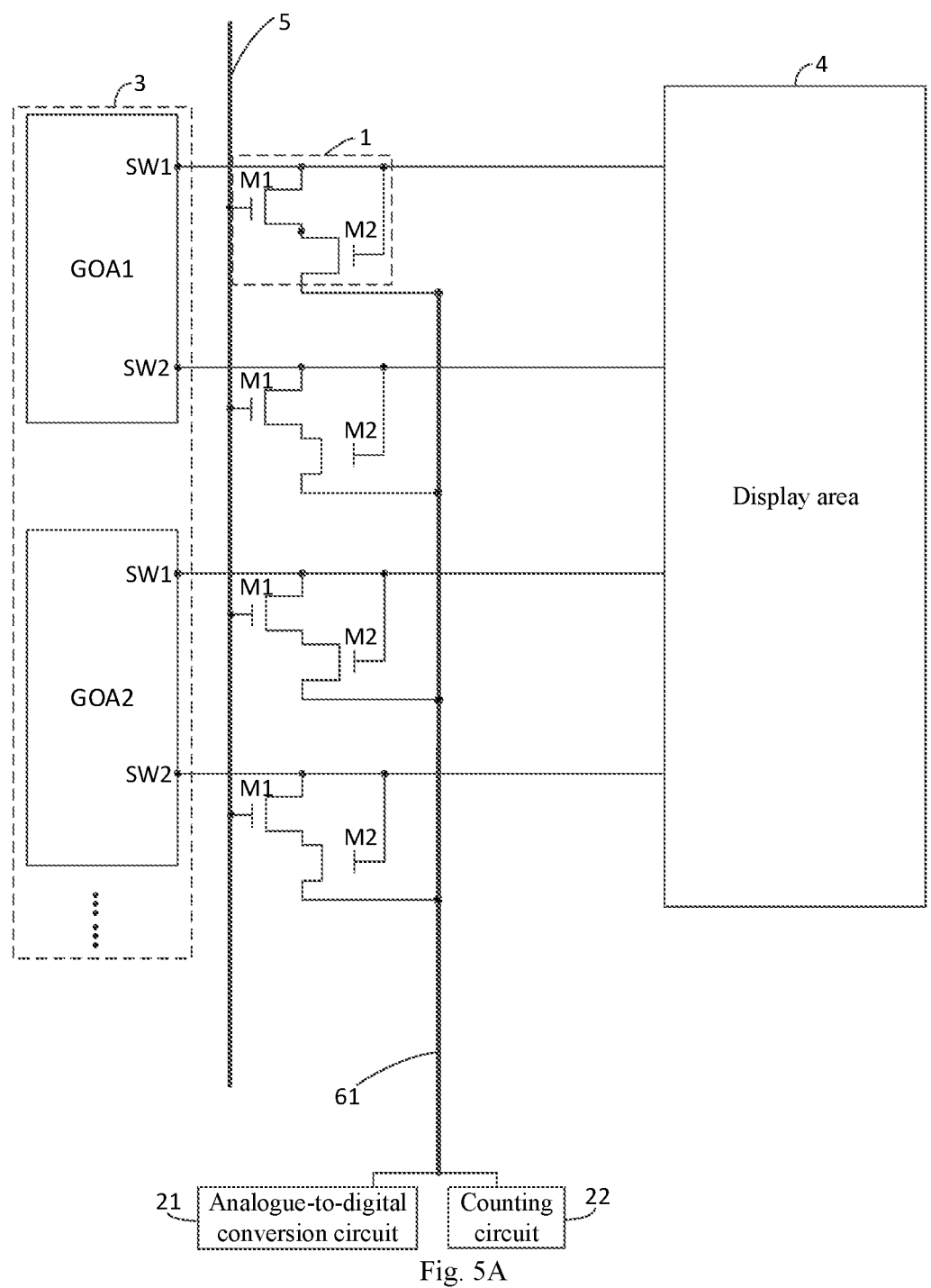
FIG. 5A is another structural schematic diagram of a detection circuit of a gate driver provided in an embodiment of the present disclosure.
Figure 5B:
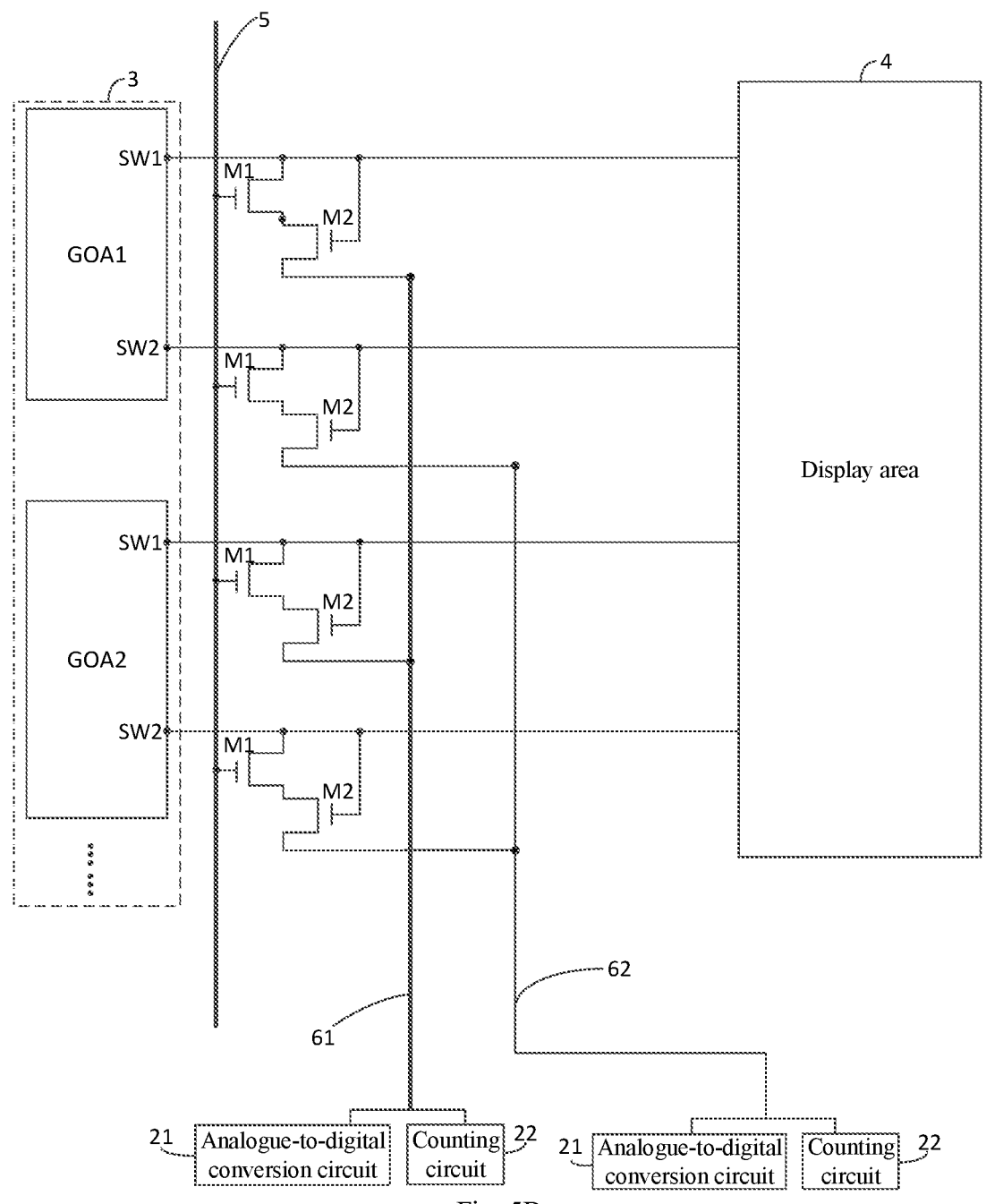
FIG. 5B is another structural schematic diagram of a detection circuit of a gate driver provided in an embodiment of the present disclosure.

Optionally, during specific implementation, in the display device containing the above detection circuit of gate driver provided in an embodiment of the present disclosure, as shown in FIG. 5A and FIG. 5B, the discrimination circuit 2 includes an analogue-to-digital conversion circuit 21 and a counting circuit 22.

The analogue-to-digital conversion circuit 21 is coupled with the detection signal line 22, and the analogue-to-digital conversion circuit 21 is configured to convert gate scanning signals into digital signals; and the counting circuit 22 is coupled with the analogue-to-digital conversion circuit 21, and the counting circuit 22 is configured to accumulate the number of pulses of digital signals, to perform abnormality diagnosis on the gate scanning signals.

Optionally, in the above detection circuit of the gate driver provided in an embodiment of the present disclosure, each of the first signal deriving sub-circuits 11 can be coupled with the same control signal line 5, to save the space of the peripheral area occupied by wiring.

During specific implementation, the first reference signals VDD1 loaded on the control signal line 5 can be periodic signals, i.e., clock signals, as shown in FIG. 1B, FIG. 2B, FIG. 3C and FIG. 3D, and can also be direct current signals. When periodic signals are taken as the first reference signals VDD1, the signal timing sequence needs to be controlled to be turned off before the acquired gate scanning signals are turned off, that is, a signal falling edge of the first reference signals VDD1 is earlier than a falling edge of the acquired gate scanning signals, thereby ensuring that the gate scanning signals, output after the gate scanning signals output by the signal deriving circuit 1 are transmitted to an analogue-to-digital conversion circuit of a discrimination circuit 2 through a detection signal line 6 for conversion, are obviously recognizable and complete square waveform signals, so as to facilitate accumulation of the number of square waves in the square waveforms by the counting circuit, and further improve accuracy of abnormality diagnosis on the gate scanning signals.

Figure 6A:
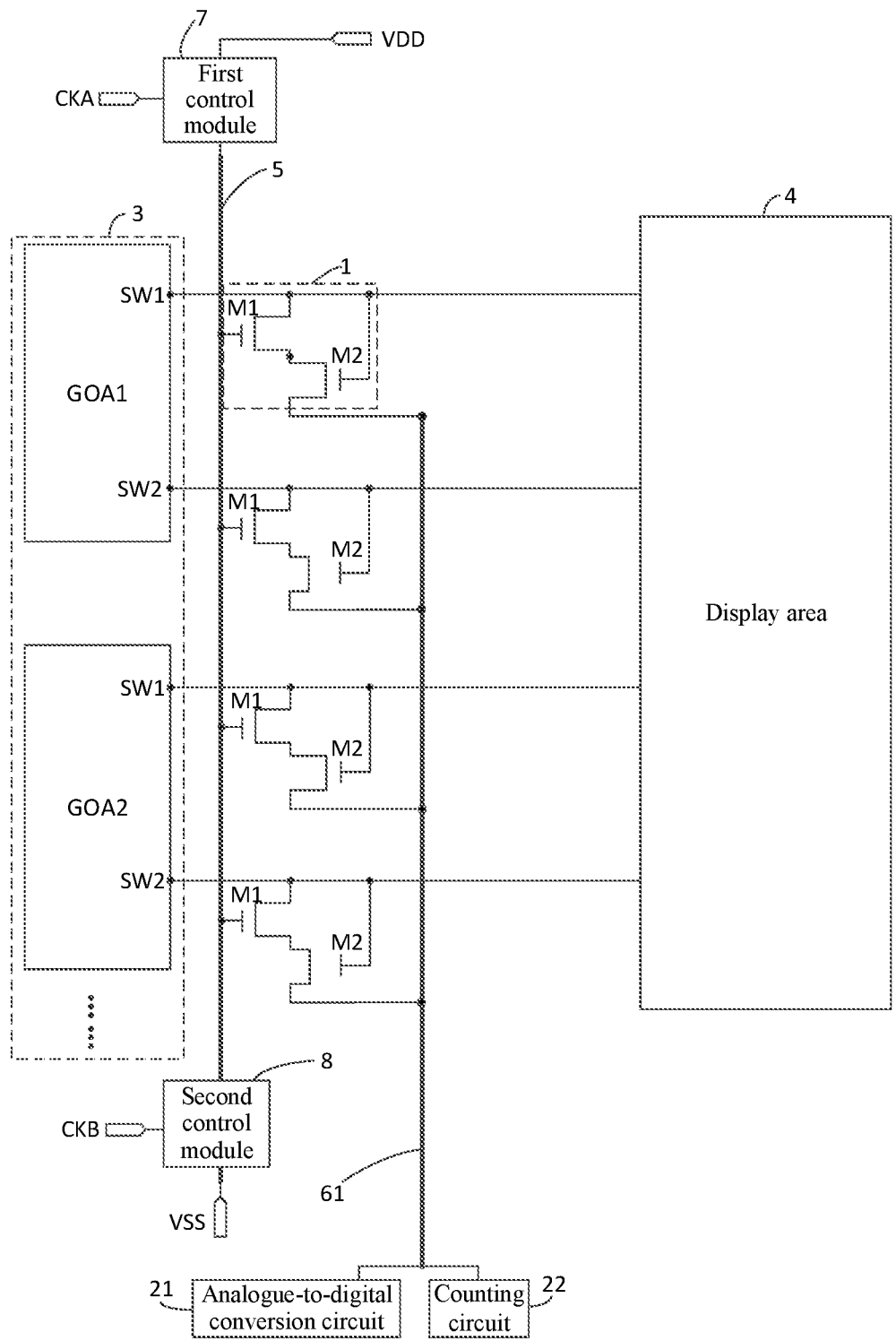
FIG. 6A is another structural schematic diagram of a detection circuit of a gate driver provided in an embodiment of the present disclosure.
Figure 6B:
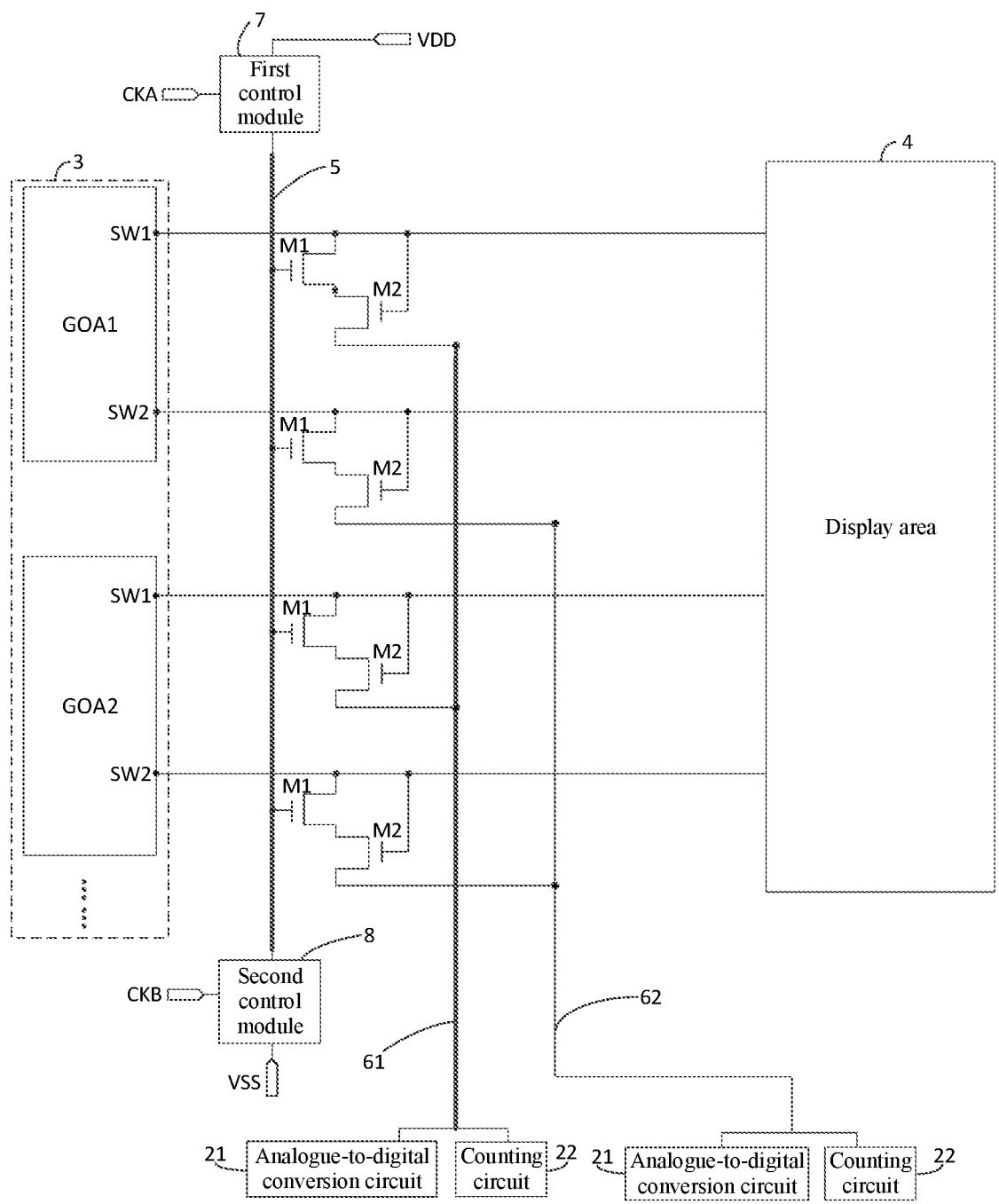
FIG. 6B is another structural schematic diagram of a detection circuit of a gate driver provided in an embodiment of the present disclosure.

Optionally, in the above detection circuit of the gate driver provided in an embodiment of the present disclosure, in order that the first reference signals VDD1 loaded by the control signal line 5 are periodic signals, as shown in FIG. 6A and FIG. 6B, the detection circuit can further include a first control circuit 7 connected between one end of the control signal line 5 and the first reference signal end VDD, and a second control circuit 8 arranged between the other end of the control signal line 5 and the second reference signal end VSS.

The control end of the first control circuit 7 is coupled with the first clock signal end CKA, the input end of the first control circuit 7 is coupled with the first reference signal end VDD, and the output end of the first control circuit 7 is coupled with one end of the control signal line 5. The first control circuit 7 is configured to transmit the first reference signals of the first reference signal end VDD to the control signal line 5 under the control of the first clock signals loaded by the first clock signal end CKA. When abnormality detection of the gate scanning signals are performed, the gate of the first switch transistor M1 is turned on through the first reference signals output by the first control circuit 7, such that the gate scanning signals are transmitted to the second switch transistor M2 through the first switch transistor M1, and are transmitted to the detection circuit through the detection signal line, to perform abnormality diagnosis of the gate scanning signals.

The control end of the second control circuit 8 is coupled with the second clock signal end CKB, the input end of the second control circuit 8 is coupled with the second reference signal end VSS, and the output end of the second control circuit 8 is coupled with the other end of the control signal line 5. The second control circuit 8 is configured to transmit the second reference signals of the second reference signal end VSS to the control signal line 5 under the control of the second clock signals loaded by the second clock signal end CKB, such that the gate of the first signal deriving sub-circuit 11, i.e., the first switch transistor M1, disconnects the signal output end such as SW1 from the second signal deriving sub-circuit 12, i.e., the second switch transistor M2 under the control of the second reference signals. When abnormality detection of the gate scanning signals is not performed, the gate of the first switch transistor M1 is turned off through the second reference signals output by the second control circuit 8, to ensure that the signal deriving circuit 1 does not influence normal display of the display panel.

Figure 7A:
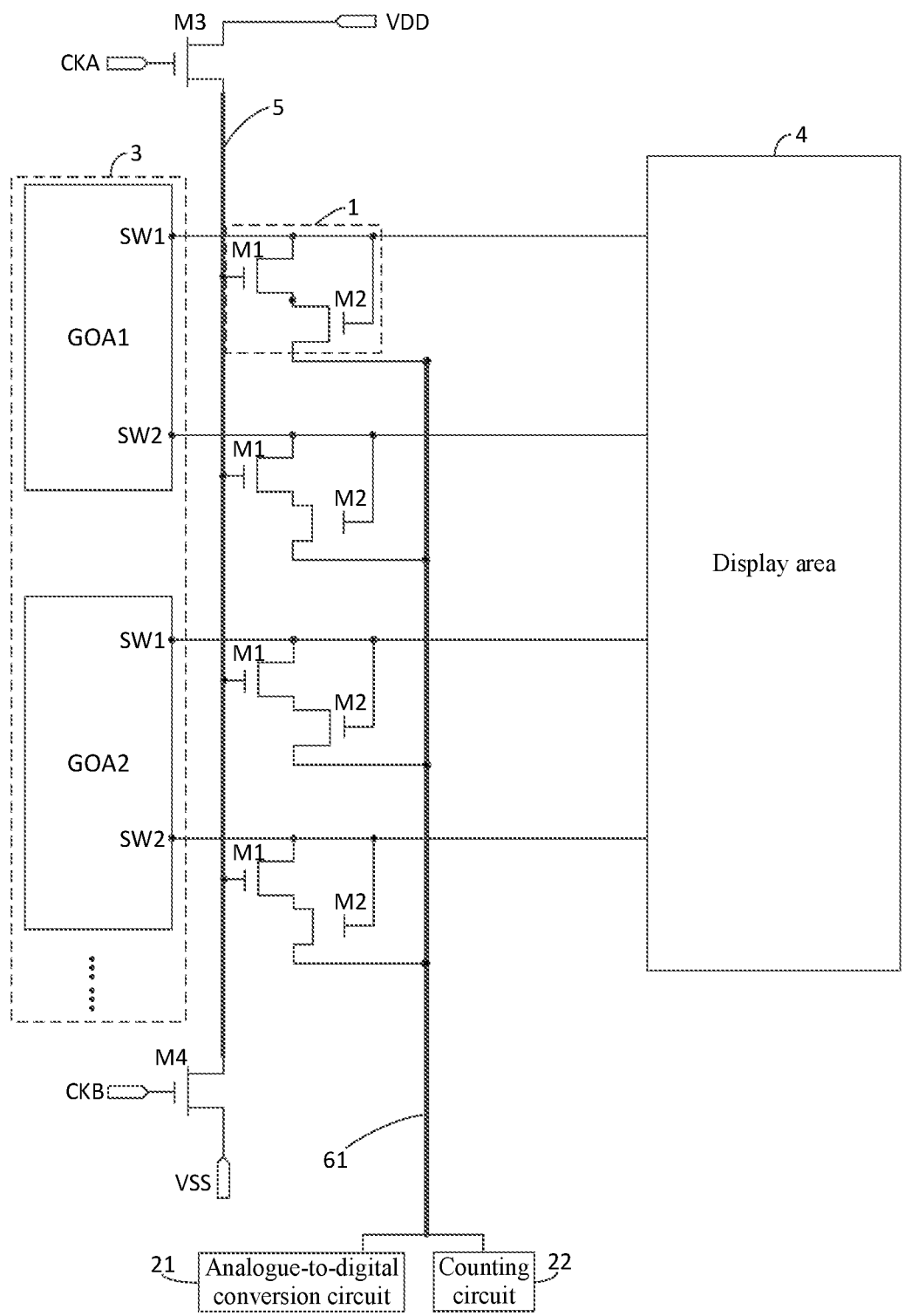
FIG. 7A is another structural schematic diagram of a detection circuit of a gate driver provided in an embodiment of the present disclosure.
Figure 7B:
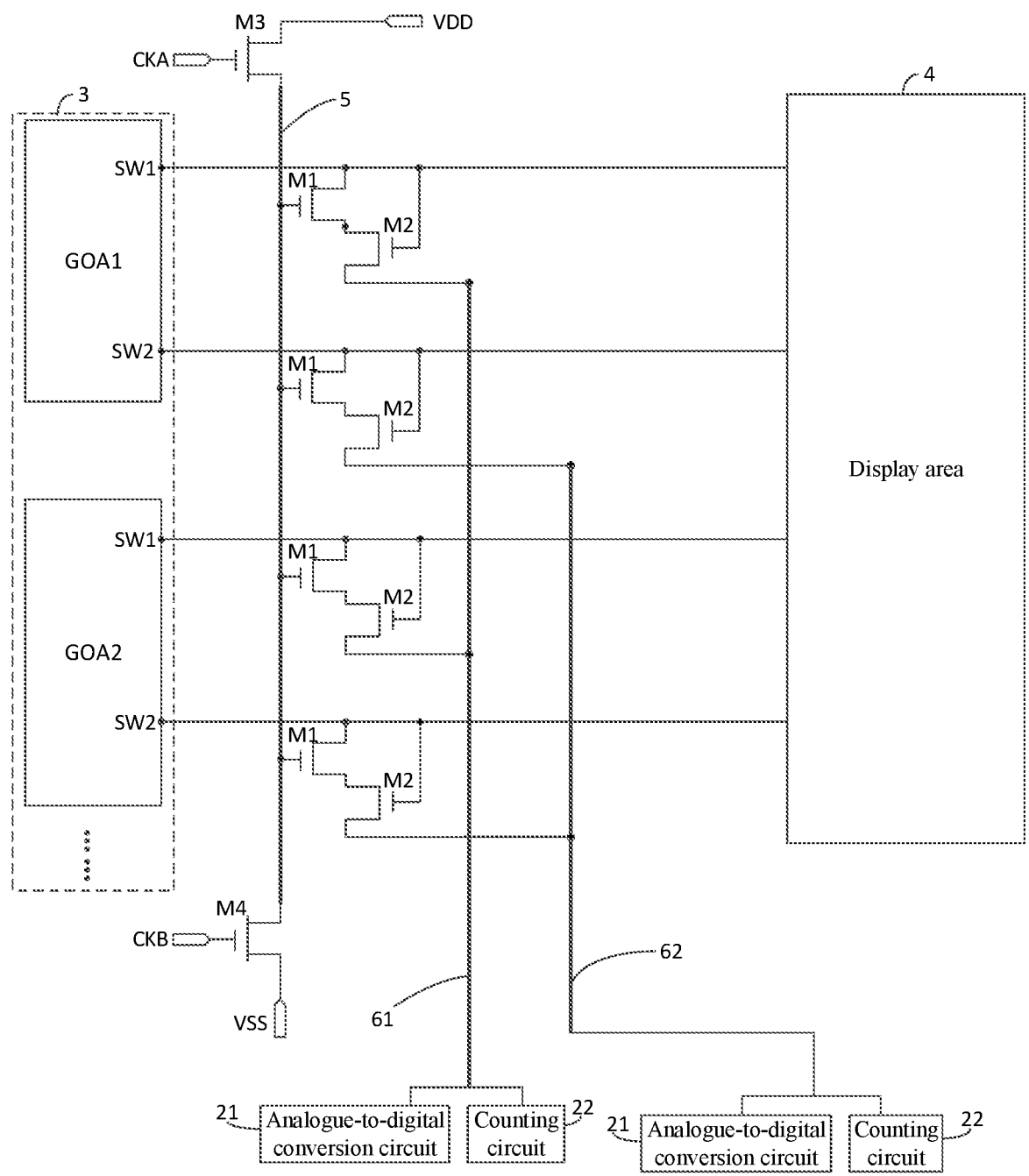
FIG. 7B is another structural schematic diagram of a detection circuit of a gate driver provided in an embodiment of the present disclosure.

Optionally, during specific implementation, in the above detection circuit of the gate driver provided in an embodiment of the present disclosure, as shown in FIG. 7A and FIG. 7B, the first control circuit 7 can include a third switch transistor M3, wherein the gate of the third switch transistor M3 is coupled with the first clock signal end CKA, the first electrode of the third switch transistor M3 is coupled with the first reference signal end VDD, and the second electrode of the third switch transistor M3 is coupled with the control signal line 5. Specifically, under the control of the first clock signals loaded by the first clock signal end CKA, the first reference signals of the first reference signal end VDD are transmitted to the control line 5 through the third switch transistor M3, and the first reference signals on the control line 5 control the first switch transistor M1 to be turned on for abnormality detection of gate scanning signals.

Optionally, during specific implementation, in the above detection circuit of the gate driver provided in an embodiment of the present disclosure, as shown in FIG. 7A and FIG. 7B, the second control circuit 8 can include a fourth switch transistor M4, wherein the gate of the fourth switch transistor M4 is coupled with the second clock signal end CKB, the first electrode of the fourth switch transistor M4 is coupled with the second reference signal end VSS, and the second electrode of the fourth switch transistor M4 is coupled with the control signal line 5. Specifically, under the control of the second clock signals loaded by the second clock signal end CKB, the second reference signals of the second reference signal end VSS are transmitted to the control line 5 through the fourth switch transistor M4, and the second reference signals on the control line 5 control the first switch transistor M1 to be turned off for the function of normal display.

Based on the same invention concept, an embodiment of the present disclosure further provides an array substrate, as shown in FIG. 1A to FIG. 10B, the array substrate includes a gate driver 3 which is provided with multiple signal output ends; multiple gate lines, wherein one of the gate lines is coupled with one of the signal output ends, that is, the signal output ends are in one-to-one correspondence with the gate lines; multiple drive circuits arranged in an array, wherein one of the drive circuits is coupled with at least one gate line; and the above detection circuit provided in an embodiment of the present disclosure.

Optionally, in the above array substrate provided in an embodiment of the present disclosure, the gate lines and the drive circuit are generally arranged in the display area 4, the detection circuit and the gate driver 3 are arranged in the peripheral area, and the gate lines extend to the peripheral area from the display area 4 and are coupled with the one-to-one corresponding signal output ends.

Figure 8:
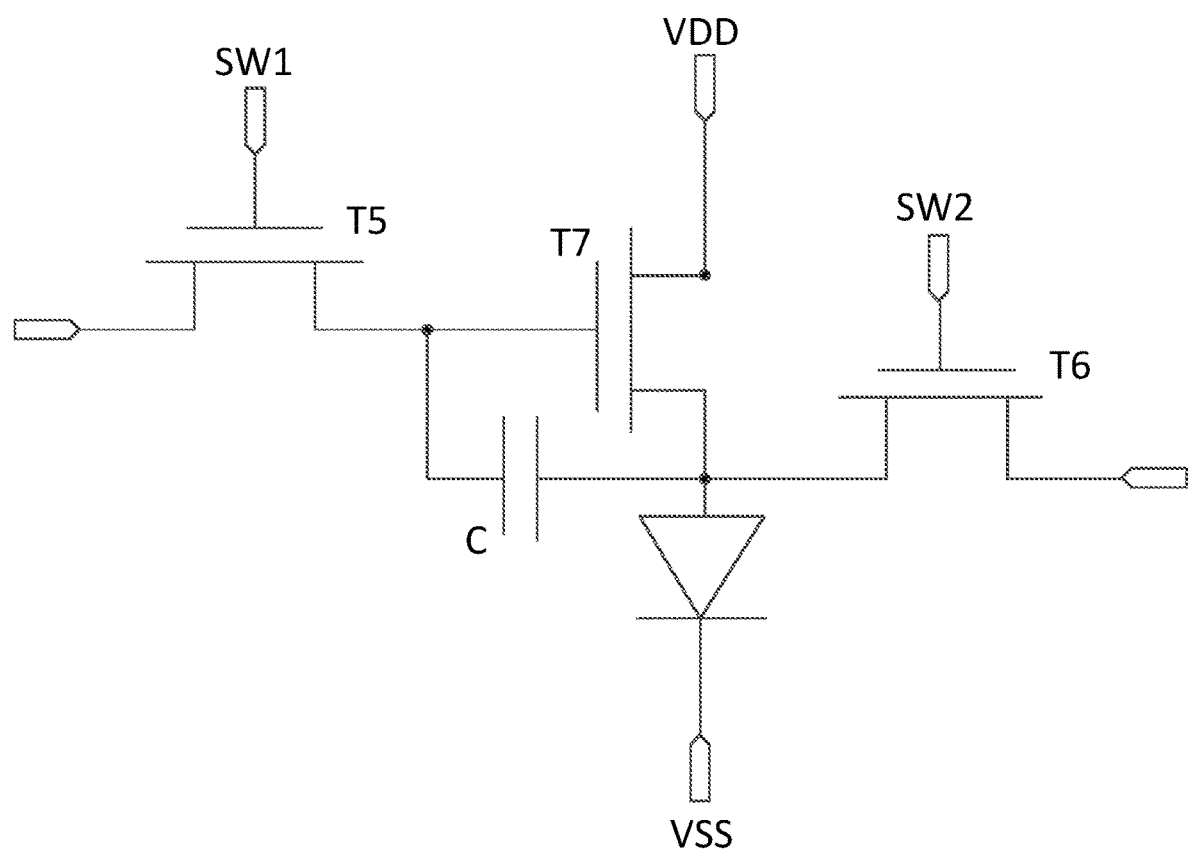
FIG. 8 is a structural schematic diagram of a drive circuit in an array substrate provided in an embodiment of the present disclosure.
Figure 9A:
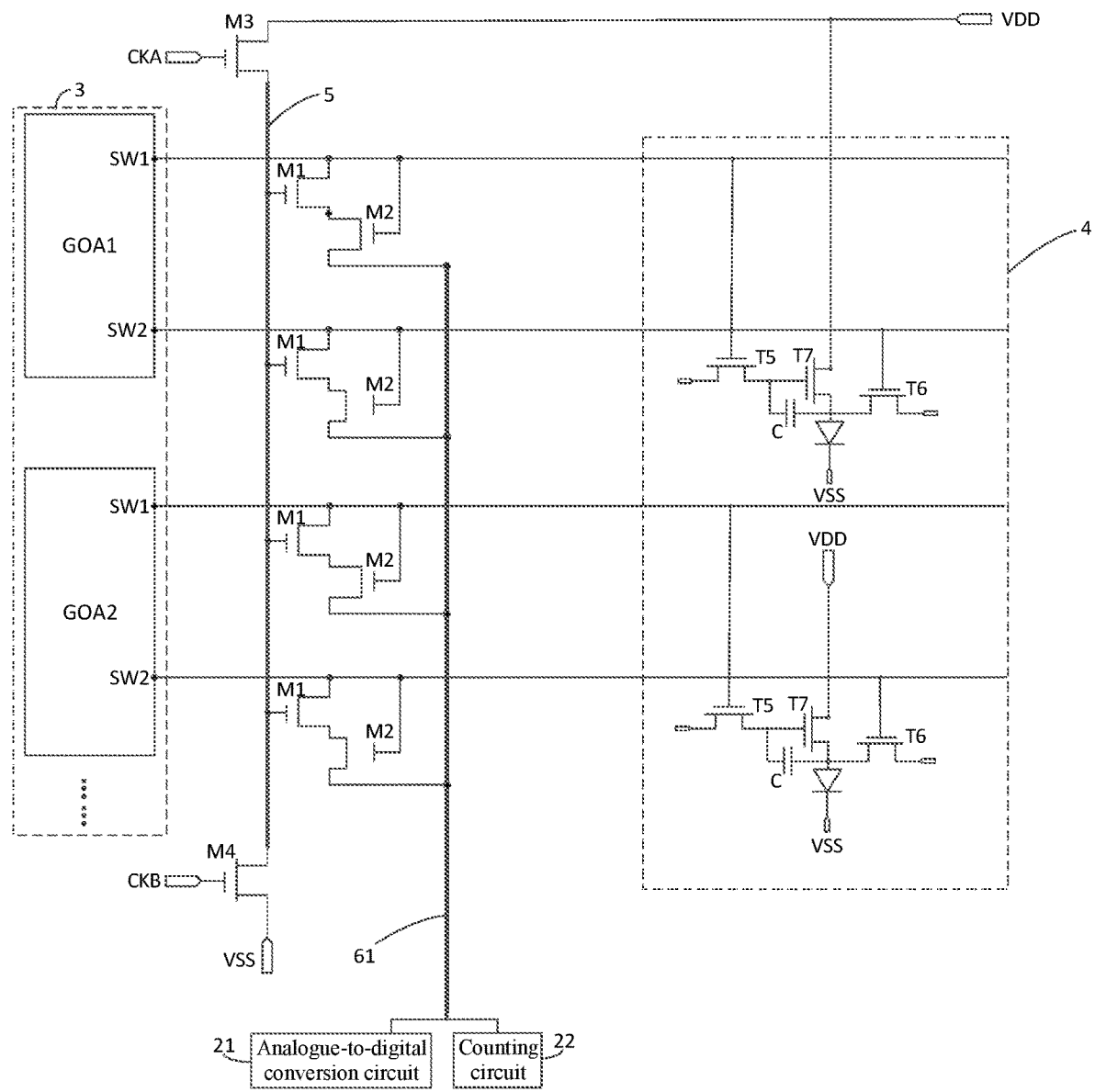
FIG. 9A is a structural schematic diagram of an array substrate provided in an embodiment of the present disclosure.
Figure 9B:
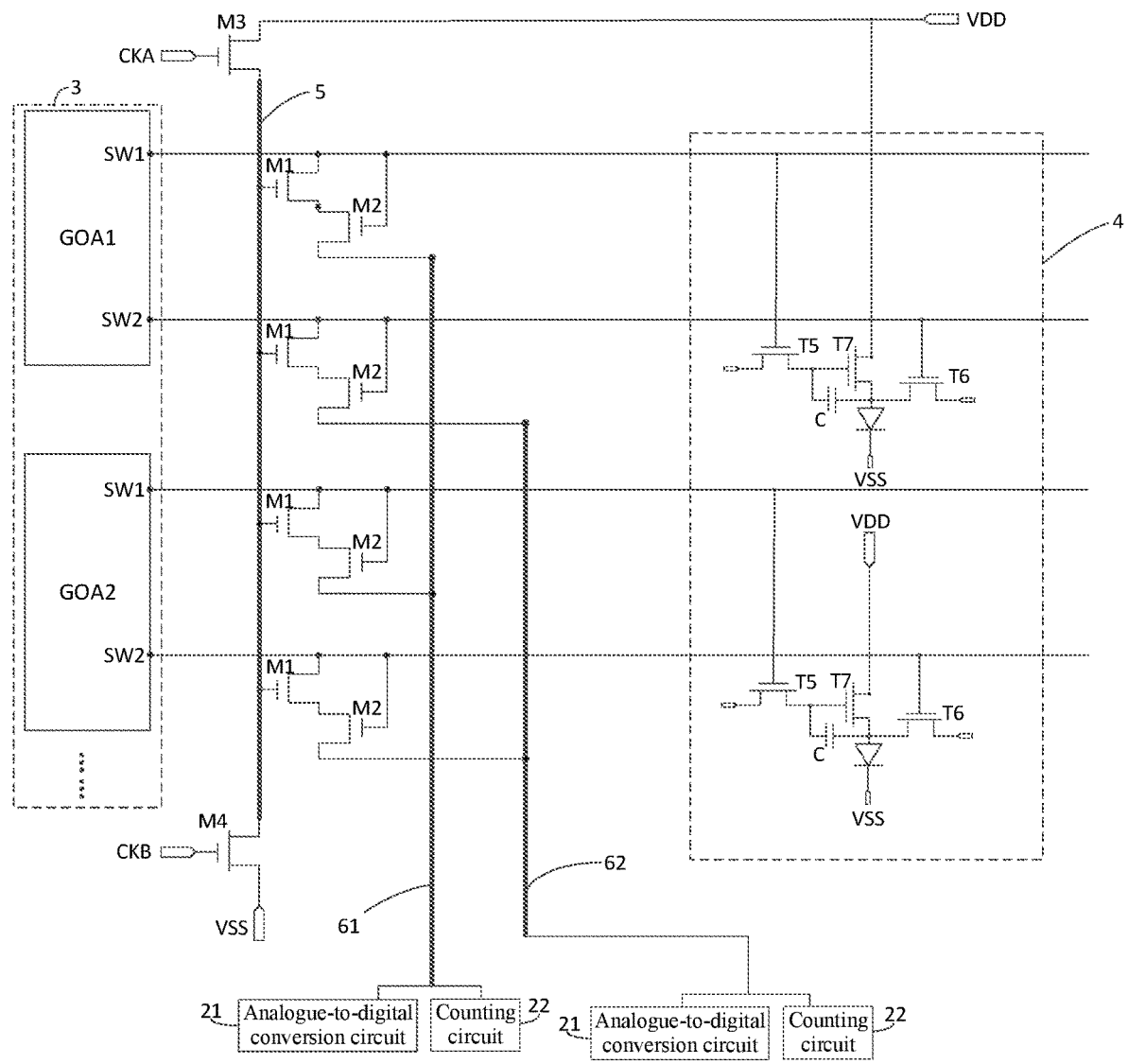
FIG. 9B is another structural schematic diagram of an array substrate provided in an embodiment of the present disclosure.

Optionally, in the above array substrate provided in an embodiment of the present disclosure, the drive circuit can be of multiple structures, for example, as shown in FIG. 8, the drive circuit can include a 3T (T5, T6 and T7) 1C structure, and each of the shifting registers includes two signal output ends, which are respectively a first signal output end SW1 and a second signal output end SW2. As shown in FIG. 9A and FIG. 9B, the signal output end SW1 of each shifting register is connected to a gate of the fifth switch transistor T5, and the source of the fifth switch transistor T5 is coupled with the data line. The gate of the drive transistor T7 is coupled with the drain of the fifth switch transistor T5, and the source of the drive transistor T7 is coupled with the first supply voltage signal end VDD. The signal output end SW2 is connected to the gate of the sixth switch transistor T6, the source of the sixth switch transistor T6 is coupled with the drain of the drive transistor T7, and the drain of the sixth switch transistor T6 is coupled with the induction signal line. The capacitor C is coupled between the gate and drain of the drive transistor T7, and the to-be-driven element is coupled between the drain of the drive transistor T7 and the second supply voltage signal end VSS.

Moreover, as shown in FIG. 9A and FIG. 9B, the first supply voltage signal end and the first reference signal end can be the same end, and the second supply voltage signal end and the second reference signal end can be the same signal end, to save wiring space.

In the above illustration, the drive circuit shown in FIG. 8 which has two gate signal input ends is taken as an example. Of course, during specific implementation, the drive circuit can include three or even more gate signal input ends, in this way, the number of signal output ends of the corresponding shifting register is the same as the number of the gate signal input ends of the drive circuit, and different signal output ends of the same shifting register can be connected to different discrimination circuits through a signal deriving circuit, to perform abnormality detection of gate scanning signals.

Figure 10A:
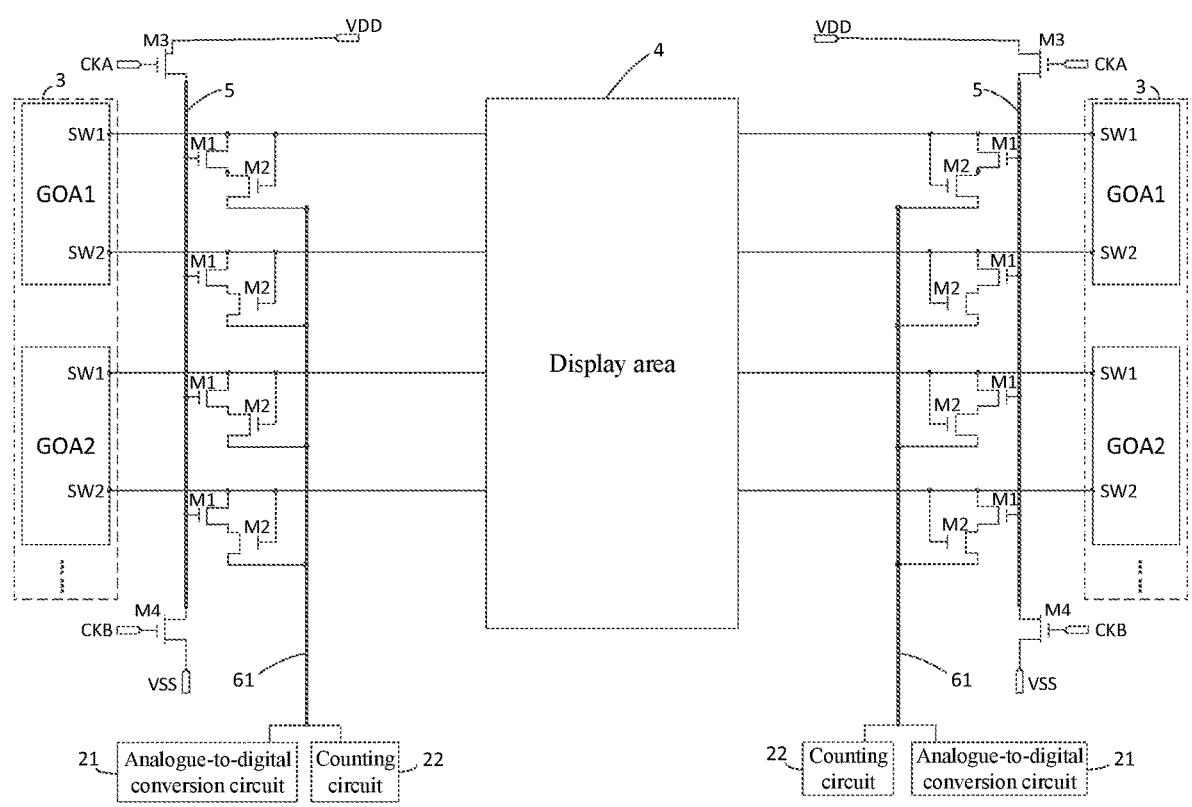
FIG. 10A is another structural schematic diagram of an array substrate provided in an embodiment of the present disclosure.
Figure 10B:
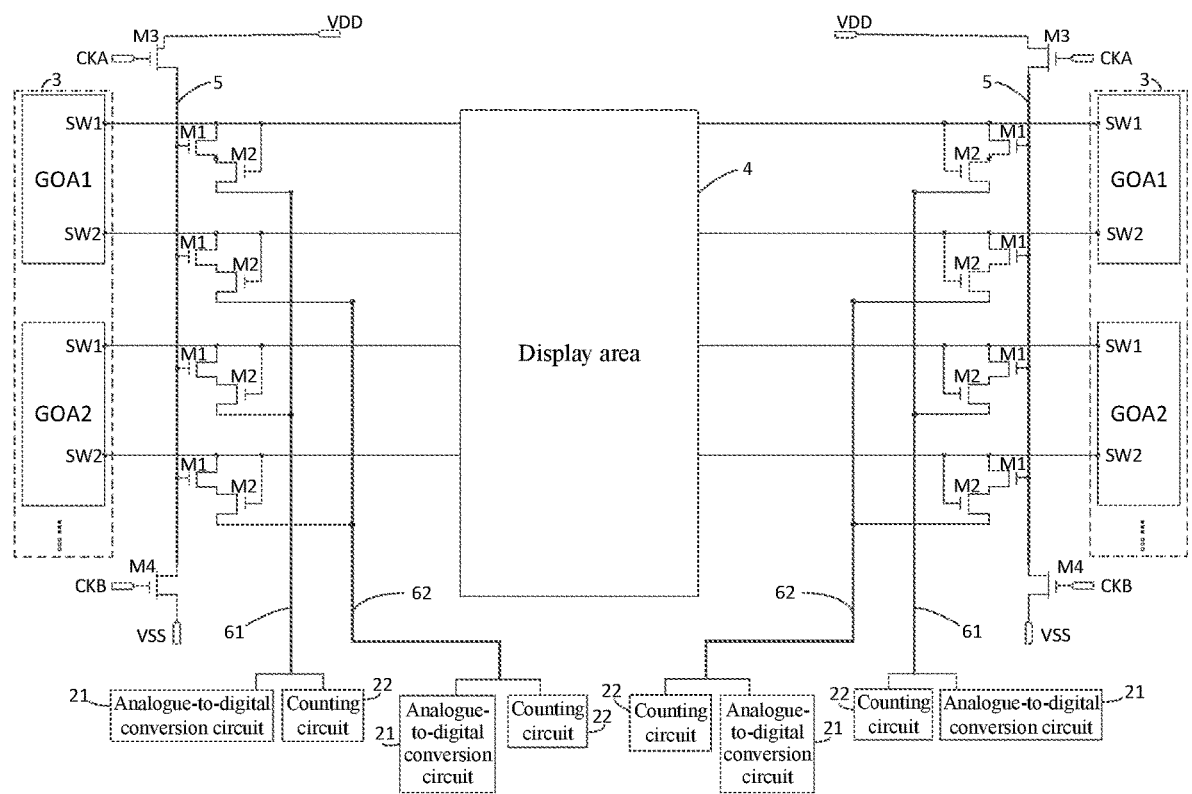
FIG. 10B is another structural schematic diagram of an array substrate provided in an embodiment of the present disclosure.

During specific implementation, in the above array substrate provided in an embodiment of the present disclosure, the gate driver driving the gate line unilaterally is taken as an example for illustration. Of course, the gate line can also be drive bilaterally by the gate driver, as shown in FIG. 10A and FIG. 10B, two sides of the display area 4 both include a group of a gate driver 3 and a detection circuit. One group of a gate driver 3 and a detection circuit are arranged on the side at which one end of the gate line Gate is located, and this group of a gate driver 3 and a detection circuit are connected with one end of the gate line Gate; the other group of a gate driver 3 and a detection circuit are arranged on the side at which the other end of the gate line Gate is located, and this group of a gate driver 3 and a detection circuit are connected with the other end of the gate line Gate. Through the setting of two groups of gate drivers 3 and detection circuits, on the one hand, two gate drivers 3 can drive the gate line Gate bilaterally, to ensure stable output of gate scanning signals; on the other hand, two detection circuits can jointly detect the gate scanning signals at two ends of the gate line Gate, so as to perform abnormality analysis and diagnosis on the gate scanning signals on the gate line Gate based on the gate scanning signals at two ends of the gate line Gate, and further improve sufficiency and accuracy of abnormality diagnosis.

During specific implementation, when the gate line is driven bilaterally by the gate driver, one detection circuit and the other detection circuit simultaneously acquire and record gate scanning signals of one end and the other end of the gate line. Of course, when the gate driver drives the gate line bilaterally, one detection circuit and the other detection circuit can also acquire and record successively the gate scanning signals of one end and the other end of the gate line, which is not limited herein.

Based on the same invention concept, an embodiment of the present disclosure further provides a display device which includes the above array substrate. The display device can be a mobile phone, a tablet computer, a television, a display, a notebook computer, a digital photo frame, a navigator and any other display panels of products with a display function. For the implementation of the display device, please refer to the embodiments of the above detection circuit of the gate driver, and the repeated part will not be repeated redundantly herein.

Based on the same invention concept, an embodiment of the present disclosure further provides a detection method of the above display device, including: controlling the plurality of signal output ends of the gate driver to output in sequence gate scanning signals; loading a first reference signal to the control signal line in a detection time period, the first signal deriving sub-circuits transmit the gate scanning signals output by coupled signal output ends to the second signal deriving sub-circuits under the control of the first reference signal, and the second signal deriving sub-circuits transmit received gate scanning signals to a coupled detection signal line under the control of the gate scanning signals output by the coupled signal output ends; and performing, by the discrimination circuit, abnormality diagnosis on the gate scanning signals transmitted by the detection signal line.

Further, the performing by the discrimination circuit, abnormality diagnosis on the gate scanning signals transmitted by the detection signal line specifically includes: converting, by an the analogue-to-digital conversion circuit, the received gate scanning signals into digital signals; and accumulating, by a counting circuit, a quantity of pulses of received digital signals, to perform abnormality diagnosis on the gate scanning signals.

Further, the above detection method can further include: in a non-detection stage, loading second reference signals to the control signal line, and disconnecting, by the first signal deriving sub-circuits, the signal output ends from the second signal deriving sub-circuits.

Specifically, in order to simplify the preparation technology, during specific implementation, in the above detection circuit of the gate driver provided in an embodiment of the present disclosure, as shown in FIG. 7A to FIG. 10B, all the switch transistors can be all N-type switching transistors and can also be P-type switch transistors. In an embodiment of the present disclosure, all the switch transistors being N-type switch transistors is taken as an example for illustration.

Further, during specific implementation, the N-type switch transistor is switched on under the effect of a high potential, and is cut off under the effect of a low potential; and the P-type switch transistor is cut off under the effect of a high potential, and is switched on under the effect of a low potential.

Further, during specific implementation, the first reference signals of the first reference signal end are high-potential signals, and the second reference signals of the second reference signal end are low-potential signals.

It should be noted that, the switch transistor mentioned in the above embodiment of the present disclosure can be a thin film transistor (TFT), and can also be a metal oxide semiconductor (MOS) field-effect transistor, which will not be defined herein. During specific implementation, the functions of the first electrode and the second electrode of these switch transistors can be exchanged according to the differences in type of transistors and input signals, which will not be specifically distinguished herein.

It should be noted that, in the above detection circuit of the gate driver provided in an embodiment of the present disclosure, the first clock signal of the first clock signal end and the second clock signal of the second clock signal end have the same period and opposite phases.

Figure 11:
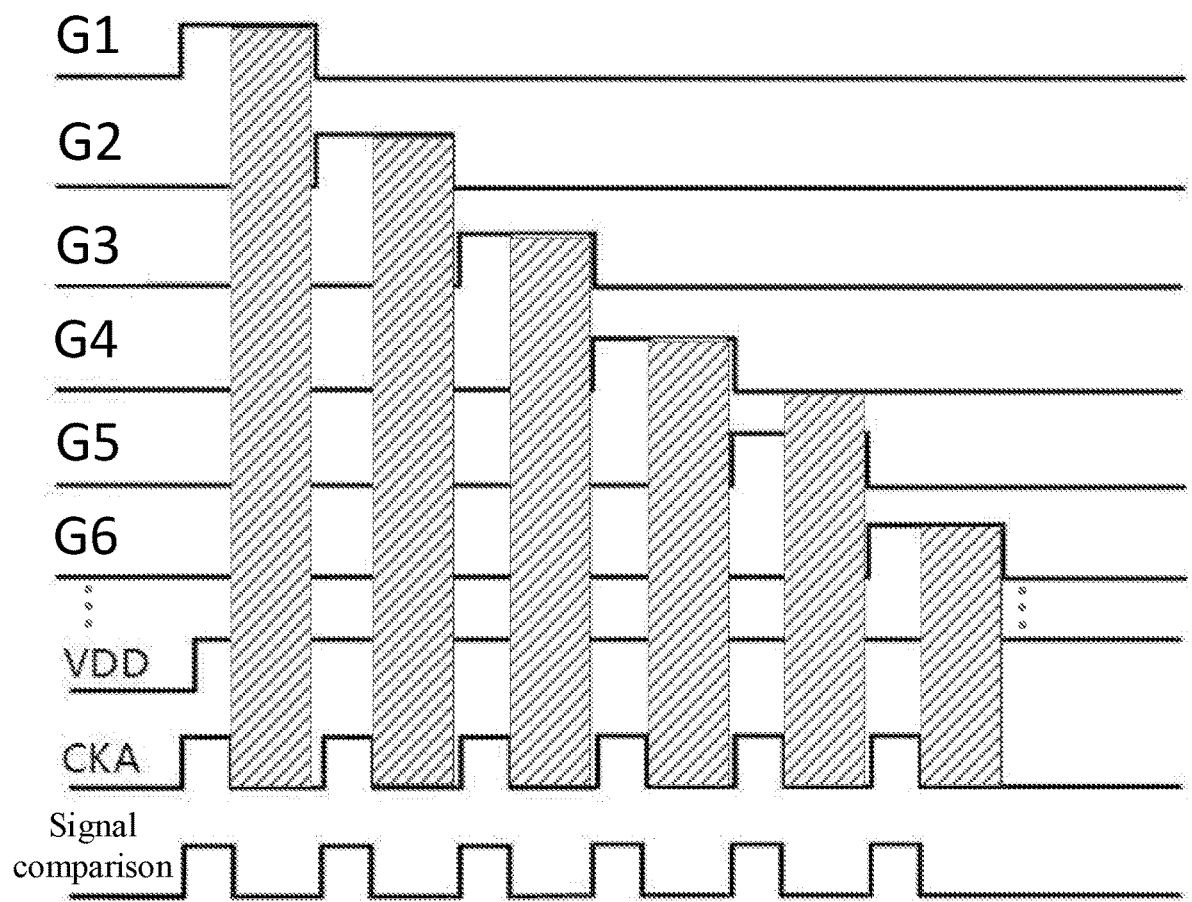
FIG. 11 is an input-output sequence chart when a detection circuit of a gate driver shown in FIG. 7A detects gate scanning signals.
Figure 12:
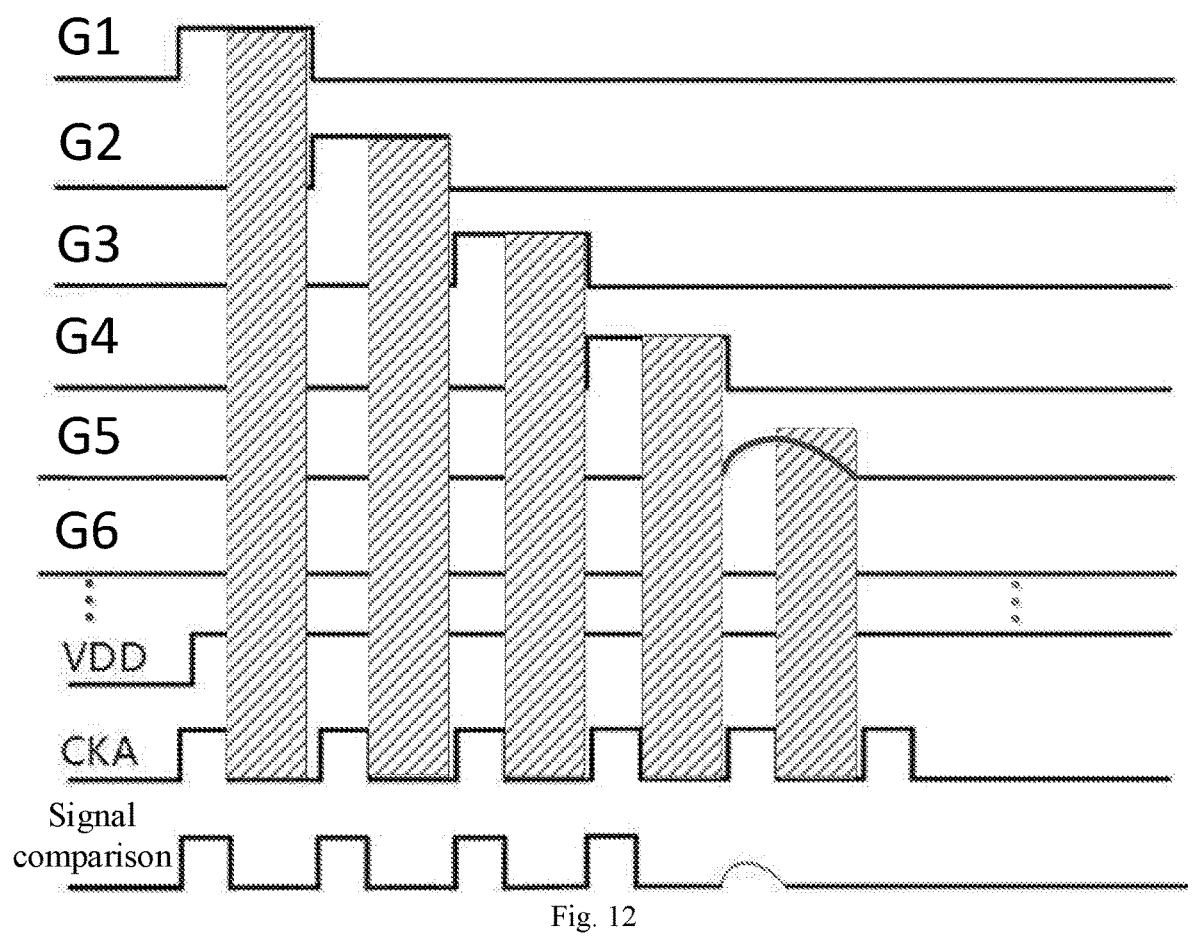
FIG. 12 is another input-output sequence chart when a detection circuit of a gate driver shown in FIG. 7A detects gate scanning signals.

With all the switch transistors being N-type switch transistors as shown in FIG. 7A as an example, the working process of the detection circuit of the gate driver will be described in detail. When the gate scanning signals output by each of the signal output ends SW1 and SW2 are overlapped without a timing sequence, the input-output sequence charts corresponding to the gate scanning signals are as shown in FIG. 11 and FIG. 12. The second electrodes of the second switch transistor M2 in the signal deriving circuit connected with the signal output ends SW1 and SW2 in the cascaded shifting registers are all connected to a discrimination circuit through the first detection signal line 61, the gate lines connected to the signal output ends SW1 and SW2 in each shifting register are G1, G2, G3, G4, G5 and G6 in sequence, and the gate scanning signals on any two arbitrary gate lines are continuously output in sequence. During abnormality detection, the first clock signals loaded by the first clock signal end CKA are high-potential signals, and the gate of the third switch transistor M3 is turned on under the control of the high-potential first clock signals. The high-potential first reference signals of the first reference signal end VDD are transmitted to the control signal line 5 through the third switch transistor M3, the first switch transistor M1 is switched on under the control of the high-potential first reference signal on the control signal line 5, and the second switch transistor M2 is switched on under the control of the gate scanning signals output by the signal output end SW1. The gate scanning signals are transmitted to the second switch transistor M2 through the first switch transistor M1, transmitted to the first detection signal line 61 through the second switch transistor M2, and transmitted to the discrimination circuit 2 through the first detection signal line 61. The analogue-to-digital conversion circuit 21 in the discrimination circuit 2 converts the received gate scanning signals to digital signals, and the counting circuit 22 accumulates the number of pulses of digital signals, to perform abnormality diagnosis on the gate scanning signals. In the above detection circuit of the gate driver provided in an embodiment of the present disclosure, if the shifting registers of the gate driver are driven level by level, once an upper level of shifting register is abnormal, a lower level of shifting register cannot work normally. FIG. 12 is an input-output sequence chart when gate scanning signals are abnormal. Abnormality detection can be performed by the above detection circuit of the gate driver provided in an embodiment of the present disclosure. As shown in FIG. 12, once the gate scanning signals input to the gate line G5 are abnormal, the gate scanning signals input to the gate line G6 are also abnormal. Therefore, the waveform obtained by signals in FIG. 12 can only obtain 4 normal pulse signals, at this time, the analogue-to-digital conversion circuit can convert acquired analogue signals into digital signals, and the counting circuit records how many pulse signals are received, so as to perform abnormality analysis on the gate scanning signals. FIG. 11 is an input-output sequence chart when gate scanning signals are normal. When the gate scanning signals are normal, the second clock signals loaded by the second clock signal end CKB are low-potential signals, the gate of the fourth switch transistor M4 is cut off under the control of the low-potential second clock signals, the low-potential second reference signals of the second reference signal end VSS are transmitted to the control signal line 5 through the fourth switch transistor M4, the first switch transistor M1 is cut off under the control of the low-potential second reference signals on the control signal line 5, and the signal output end SW1 and the second switch transistor M2 are disconnected, thereby having no influence on normal display of a display panel.

With all the switch transistors being N-type switch transistors as shown in FIG. 7B as an example, the working process of the detection circuit of the gate driver will be described in detail. When the gate scanning signals output by each of the signal output ends SW1 and SW2 are overlapped in a timing sequence, the input-output sequence chart corresponding to the gate scanning signals is as shown in FIG. 3D. The second electrodes of the second switch transistor M2 in the signal deriving circuit connected with the signal output end SW1 in each of the cascaded shifting registers are all connected to a discrimination circuit through the first detection signal line 61, the second electrodes of the second switch transistor M2 in the signal deriving circuit connected with the signal output end SW2 in each of the cascaded shifting registers are all connected to a discrimination circuit through the second detection signal line 62, and detection is performed separately. The detection principles are the same as the detection principles in FIG. 7A, and will not be repeated redundantly herein.

During specific implementation, as shown in FIG. 11 and FIG. 12, the first clock signals of the first clock signal end CKA and the second clock signals of the second clock signal end CKB are all closed before the gate scanning signals controlled to be acquired are closed, thereby ensuring that the gate scanning signals, output after the gate scanning signals output by the signal deriving circuit are transmitted to an analogue-to-digital conversion circuit of a discrimination circuit through a detection signal line for conversion, are obviously recognizable and complete square waveform signals, so as to facilitate accumulation of the number of square waves in the square waveforms by the counting circuit, and further improve accuracy of abnormality diagnosis on gate scanning signals.

As to the above detection circuit of the gate driver, the array substrate, the display device and the detection method thereof provided in an embodiment of the present disclosure, the gate scanning signals of each of the signal output ends are derived to a detection signal line through signal deriving circuits, such that the gate scanning signals are transmitted to a discrimination circuit outside the array substrate. The discrimination circuit can acquire in real time and record the gate scanning signals, so as to detect the gate scanning signals in real time, and further rapidly diagnose whether the gate scanning signals are abnormal based on detection results, and rapidly locate the position at which the gate scanning signals are abnormal, so as to timely troubleshoot the fault.

Evidently, those skilled in the art can make various modifications and variations to the present disclosure without departing from the spirit and scope of the present disclosure. Accordingly, the present disclosure is also intended to encompass these modifications and variations thereto so long as the modifications and variations come into the scope of the claims appended to the disclosure and their equivalents.

The invention claimed is:

1. A detection circuit of a gate driver, comprising:
    a plurality of first signal deriving sub-circuits, wherein a control end of each first signal deriving sub-circuit is coupled with a control signal line, and an input end of the each first signal deriving sub-circuit is coupled with at least one signal output end of the gate driver; and
    a plurality of second signal deriving sub-circuits, wherein the plurality of second signal deriving sub-circuits are in one-to-one correspondence with the plurality of first signal deriving sub-circuits, a control end of each second signal deriving sub-circuit is coupled with an output end of a corresponding first signal deriving sub-circuit, the control end of the each second signal deriving sub-circuit is coupled with a signal output end which is coupled with the corresponding first signal deriving sub-circuit, and an output end of the each second signal deriving sub-circuit is coupled with a detection signal line;

wherein the gate driver comprises a plurality of cascaded shifting registers, each shifting register comprises at least two signal output ends, and respective signal output ends of the each shifting register are coupled with different detection signal lines.

2. The detection circuit of a gate driver of claim 1, wherein the plurality of second signal deriving sub-circuits are coupled with the same detection signal line; and timing sequences of gate scanning signals output by each of the at least one signal output end corresponding to the each second signal deriving sub-circuit which is coupled with the same detection signal line are not overlapped with each other.

3. The detection circuit of a gate driver of claim 1, wherein the each first signal deriving sub-circuit comprises a first switch transistor, a gate of the first switch transistor is coupled with the control signal line, a first electrode of the first switch transistor is coupled with a corresponding signal output end, and the second electrode of the first switch transistor is coupled with a corresponding second signal deriving sub-circuit.

4. The detection circuit of a gate driver of claim 1, wherein the each second signal deriving sub-circuit comprises a second switch transistor, a gate of the second switch transistor is coupled with a corresponding signal output end, a first electrode of the second switch transistor is coupled with the corresponding first signal deriving sub-circuit, and the second electrode of the second switch transistor is coupled with a corresponding detection signal line.

5. The detection circuit of a gate driver of claim 1, wherein respective first signal deriving sub-circuits are coupled with the same control signal line.

6. The detection circuit of a gate driver of claim 5, further comprising:

a first control circuit, wherein a control end of the first control circuit is coupled with a first clock signal end, an input end of the first control circuit is coupled with a first reference signal end, and an output end of the first control circuit is coupled with one end of the control signal line; and a second control circuit, wherein a control end of the second control circuit is coupled with a second clock signal end, an input end of the second control circuit is coupled with a second reference signal end, and an output end of the second control circuit is coupled with the other end of the control signal line.

7. The detection circuit of a gate driver of claim 6, wherein the first control circuit comprises a third switch transistor, wherein a gate of the third switch transistor is coupled with the first clock signal end, a first electrode of the third switch transistor is coupled with the first reference signal end, and a second electrode of the third switch transistor is coupled with the control signal line.

8. The detection circuit of a gate driver of claim 6, wherein the second control circuit comprises a fourth switch transistor, wherein a gate of the fourth switch transistor is coupled with the second clock signal end, a first electrode of the fourth switch transistor is coupled with the second reference signal end, and a second electrode of the fourth switch transistor is coupled with the control signal line.

9. The detection circuit of a gate driver of claim 1, further comprising a discrimination circuit, and the discrimination circuit comprises:

an analogue-to-digital conversion circuit configured to be coupled with the detection signal line; and a counting circuit configured to be coupled with the analogue-to-digital conversion circuit.

10. The detection circuit of a gate driver of claim 1, wherein the each first signal deriving sub-circuit comprises a first switch transistor, the each second signal deriving sub-circuit comprises a second switch transistor, wherein a gate of the first switch transistor is coupled with the control signal line, a first electrode of the first switch transistor and a gate of the second switch transistor are coupled with the same signal output end, a second electrode of the first switch transistor is coupled with a first electrode of the second switch transistor, and a second electrode of the second switch transistor is coupled with the corresponding detection signal line;

the detection circuit further comprises a third switch transistor and a fourth switch transistor, wherein a gate of the third switch transistor is coupled with the first clock signal end, a first electrode of the third switch transistor is coupled with the first reference signal end, a second electrode of the third switch transistor is coupled with one end of the control signal line, a gate of the fourth switch transistor is coupled with the second clock signal end, a first electrode of the fourth switch transistor is coupled with a second reference signal end, and a second electrode of the fourth switch transistor is coupled with the other end of the control signal line.

11. An array substrate, comprising:

a gate driver, comprising a plurality of signal output ends;

a plurality of gate lines, wherein one of the plurality of gate lines is coupled with one of the plurality of signal output ends;

a plurality of drive circuits arranged in an array, wherein one of the plurality of drive circuits is coupled with at least one gate line; and the detection circuit of claim 1.

12. The array substrate of claim 11, wherein the gate driver comprises a plurality of cascaded shifting registers, wherein each shifting register comprises two signal output ends which are respectively a first signal output end and a second signal output end;

each drive circuit comprises:

a fifth switch transistor, wherein a gate of the fifth switch transistor is coupled with the first signal output end through one gate line, and a source of the fifth switch transistor is coupled with a data line;

a drive transistor, wherein a gate of the drive transistor is coupled with a drain of the fifth switch transistor, and a source of the drive transistor is coupled with a first supply voltage signal end;

a sixth switch transistor, wherein a gate of the sixth switch transistor is coupled with the second signal output end through one gate line, a source of the sixth switch transistor is coupled with a drain of the drive transistor, and a drain of the sixth switch transistor is coupled with an induction signal line;

a capacitor, coupled between the gate of the drive transistor and the drain of the drive transistor; and a to-be-driven element, coupled between the drain of the drive transistor and a second supply voltage signal end.

13. The array substrate of claim 12, wherein the first supply voltage signal end and the first reference signal end are the same signal end, and the second supply voltage signal end and the second reference signal end are the same signal end.

14. A display device, comprising the array substrate of any of claim 11.

15. A detection method of a display device comprising an array substrate, wherein the array substrate comprises a gate driver comprising a plurality of signal output ends, a plurality of gate lines, one of the plurality of gate lines being coupled with one of the plurality of signal output ends, a plurality of drive circuits arranged in an array, one of the plurality of drive circuits being coupled with at least one gate line, and a detection circuit; wherein the detection circuit comprises:
- a plurality of first signal deriving sub-circuits, wherein a control end of each first signal deriving sub-circuit is coupled with a control signal line, and an input end of the each first signal deriving sub-circuit is coupled with at least one signal output end of the gate driver;
- a plurality of second signal deriving sub-circuits, wherein the plurality of second signal deriving sub-circuits are in one-to-one correspondence with the plurality of first signal deriving sub-circuits, a control end of each second signal deriving sub-circuit is coupled with an output end of a corresponding first signal deriving sub-circuit, the control end of the each second signal deriving sub-circuit is coupled with a signal output end which is coupled with the corresponding first signal deriving sub-circuit, and an output end of the each second signal deriving sub-circuit is coupled with a detection signal line; and
- a discrimination circuit;
- wherein the gate driver comprises a plurality of cascaded shifting registers, each shifting register comprises at least two signal output ends, and respective signal output ends of the each shifting register are coupled with different detection signal lines;

wherein the method comprises:
- controlling the plurality of signal output ends of the gate driver to output gate scanning signals in sequence;
- loading a first reference signal to the control signal line in a detection time period, wherein the first signal deriving sub-circuits transmit the gate scanning signals output by coupled signal output ends to the second signal deriving sub-circuits under the control of the first reference signal, and the second signal deriving sub-circuits transmit received gate scanning signals to a coupled detection signal line under the control of the gate scanning signals output by the coupled signal output ends; and
- performing, by the discrimination circuit, abnormality diagnosis on the gate scanning signals transmitted by the detection signal line.

16. The detection method of claim 15, wherein the performing by the discrimination circuit, abnormality diagnosis on the gate scanning signals transmitted by the detection signal line specifically comprises:
- converting, by an analogue-to-digital conversion circuit, the received gate scanning signals into digital signals; and
- accumulating, by a counting circuit, a quantity of pulses of received digital signals, to perform abnormality diagnosis on the gate scanning signals.

17. The detection method of claim 15, further comprising:
- in a non-detection stage, loading second reference signals to the control signal line; and
- disconnecting, by the first signal deriving sub-circuits, the signal output ends from the second signal deriving sub-circuits.

* * * * *